US012765401B2

(12) United States Patent
Chiu

(10) Patent No.: US 12,765,401 B2
(45) Date of Patent: Oct. 13, 2026

(54) SEMICONDUCTOR DEVICE AND METHOD OF MANUFACTURING THE SAME

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 407 days.

(21) Appl. No.: 18/380,937

(22) Filed: Oct. 17, 2023

(65) Prior Publication Data

US 2024/0282712 A1 Aug. 22, 2024

Related U.S. Application Data

(62) Division of application No. 18/112,616, filed on Feb. 22, 2023, now Pat. No. 12,406,933.

(51) Int. Cl.

| | |
|---|---|
| ***H10W 70/60*** | (2026.01) |
| ***H10P 54/00*** | (2026.01) |
| ***H10W 42/00*** | (2026.01) |
| ***H10W 70/63*** | (2026.01) |
| ***H10W 70/685*** | (2026.01) |
| ***H10W 74/10*** | (2026.01) |

(52) U.S. Cl.

CPC ........... *H10W 70/611* (2026.01); *H10P 54/00* (2026.01); *H10W 42/121* (2026.01); *H10W 70/635* (2026.01); *H10W 70/685* (2026.01); *H10W 74/131* (2026.01)

(58) Field of Classification Search

CPC ............. H10W 70/611; H10W 70/685; H10W 70/635; H10W 42/121; H10P 54/00

See application file for complete search history.

(56) References Cited

U.S. PATENT DOCUMENTS

2008/0116569 A1 5/2008 Huang et al.
2012/0086135 A1* 4/2012 Thompson .......... H10W 70/614 257/E23.116

(Continued)

FOREIGN PATENT DOCUMENTS

TW 201523798 A 6/2015
TW 202246822 A 12/2022

OTHER PUBLICATIONS

Office Action and and the search report mailed on May 30, 2025 related to U.S. Appl. No. 18/112,616, wherein this application is a DIV of U.S. Appl. No. 18/112,616.

(Continued)

*Primary Examiner* — Mohammad M Choudhry
(74) *Attorney, Agent, or Firm* — Xuan Zhang

(57) ABSTRACT

A semiconductor device and a method of manufacturing the same are provided. The semiconductor device includes an interposer, a conductive via, an insulation layer, and a first electronic component. The interposer has a first surface and a second surface opposite to the first surface. The conductive via extends between the first surface and the second surface of the interposer. The insulation layer separates the conductive via from the interposer. The first electronic component is disposed on the second surface and electrically connected to the conductive via.

10 Claims, 29 Drawing Sheets

10

10

(56) References Cited

U.S. PATENT DOCUMENTS

| | | | | |
|---|---|---|---|---|
| 2015/0364394 | A1* | 12/2015 | Lin | H10W 20/47 257/734 |
| 2016/0343613 | A1 | 11/2016 | Uzoh | |
| 2018/0301376 | A1 | 10/2018 | Shih et al. | |
| 2020/0243450 | A1* | 7/2020 | Cho | H10W 70/65 |
| 2020/0303310 | A1 | 9/2020 | Alur et al. | |
| 2022/0328952 | A1 | 10/2022 | Liao | |
| 2024/0113087 | A1* | 4/2024 | Marin | H10W 70/68 |
| 2024/0282712 | A1 | 8/2024 | Chiu | |

OTHER PUBLICATIONS

Office Action and Search Report dated on Mar. 4, 2024 related to Taiwanese Application No. 112120765.

* cited by examiner

SEMICONDUCTOR DEVICE AND METHOD OF MANUFACTURING THE SAME

CROSS-REFERENCE TO RELATED APPLICATION

This application is a divisional application of U.S. Non-Provisional application Ser. No. 18/112,616 filed Feb. 22, 2023, which is incorporated herein by reference in its entirety.

TECHNICAL FIELD

The present disclosure relates to a semiconductor device, and more particularly, to a semiconductor device including a through-insulator via (TIV) structure.

DISCUSSION OF THE BACKGROUND

With the rapid growth of the electronics industry, integrated circuits (ICs) have achieved high performance and miniaturization. Technological advances in IC materials and design have produced generations of ICs in which each successive generation has smaller and more complex circuits.

Many techniques have been developed to increase the performance of a semiconductor device. For example, an interposer is utilized to electrically connect multiple electronic components or devices on opposite sides of the interposer by conductive vias, such as through-silicon via (TSV). However, the TSV has a relatively large parasitic capacitance, which degrades the performance of the semiconductor device. Therefore, a new semiconductor device and method of improving such problems is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes an interposer, a conductive via, an insulation layer, and a first electronic component. The interposer has a first surface and a second surface opposite to the first surface. The conductive via extends between the first surface and the second surface of the interposer. The insulation layer separates the conductive via from the interposer. The first electronic component is disposed on the second surface and electrically connected to the conductive via.

Another aspect of the present disclosure provides a semiconductor device. The semiconductor device includes an interposer, a through-insulation via (TIV), a first electronic component, and a second electronic component. The interposer has a first surface and a second surface opposite to the first surface. The interposer defines a first cavity and a second cavity extending between the first surface and the second surface. The TIV is disposed within the first cavity. The first electronic component is disposed on the second surface of the interposer and electrically connected to the TIV. The second electronic component is disposed within the second cavity.

Another aspect of the present disclosure provides a method of manufacturing a semiconductor device. The method includes: providing a substrate; defining a first cavity of the substrate; forming a through-insulation via (TIV) within the first cavity of the substrate; defining a second cavity of the substrate; disposing a first electronic component within the second cavity; and disposing a second electronic component over the TIV.

The embodiments of the present disclosure disclose a semiconductor device. The semiconductor device includes a through-insulation via (TIV) penetrating an interposer. The TIV has a relatively small parasitic capacitance in comparison with a through-silicon via (TSV). Further, in comparison with TSV which needs a polishing technique to remove a silicon substrate in order to expose the TSV, the depth of the TIV may be relatively well controlled.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
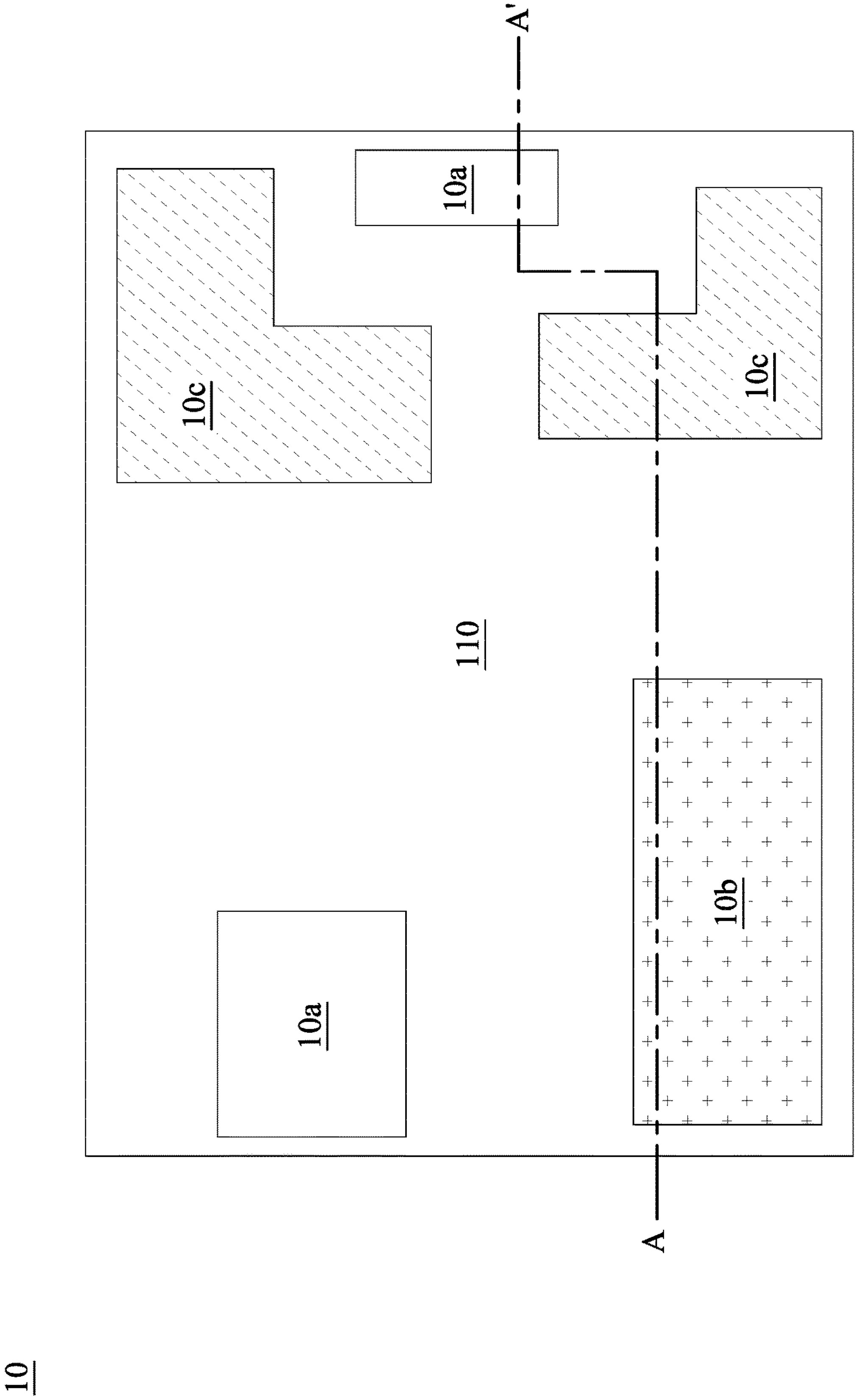
FIG. 1A is a top view of a layout of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a top view of a layout of a semiconductor device 10, in accordance with some embodiments of the present disclosure.

In some embodiments, the semiconductor device 10 may include an interposer 110. The interposer 110 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy may be formed over a silicon substrate. In some embodiments, the SiGe alloy may be mechanically strained by another material in contact with the SiGe alloy.

In some embodiments, the semiconductor device 10 may include at least one region 10*a*, at least one region 10*b*, and at least one region 10*c* on or within the interposer 110.

In some embodiments, the region 10*a* may be configured to support an electronic component which has a terminal (e.g., a conductive pad) connected to other devices by a conductive wire.

In some embodiments, the region 10*b* may be configured to accommodate a package structure or an electronic component(s) disposed within the interposer 110.

In some embodiments, the region 10*c* may be configured to form a through-insulation via (TIV), such as a through-oxide via (TOV), which may electrically connect two devices disposed on two opposite sides of the interposer 110.

Figure 1B:
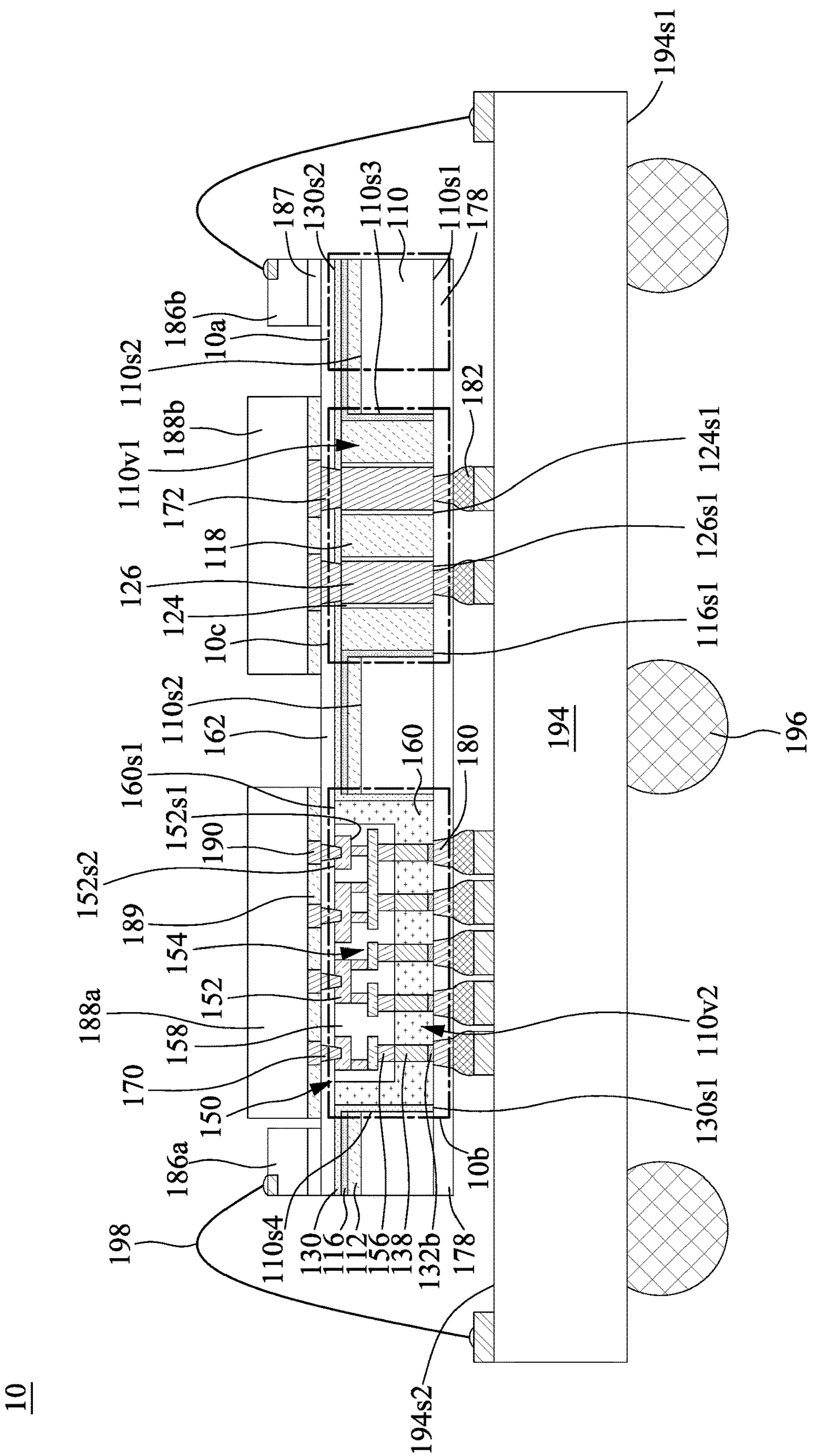
FIG. 1B is a cross-sectional view along A-A' of the semiconductor device, in accordance with some embodiments of the present disclosure.
Figure 1C:
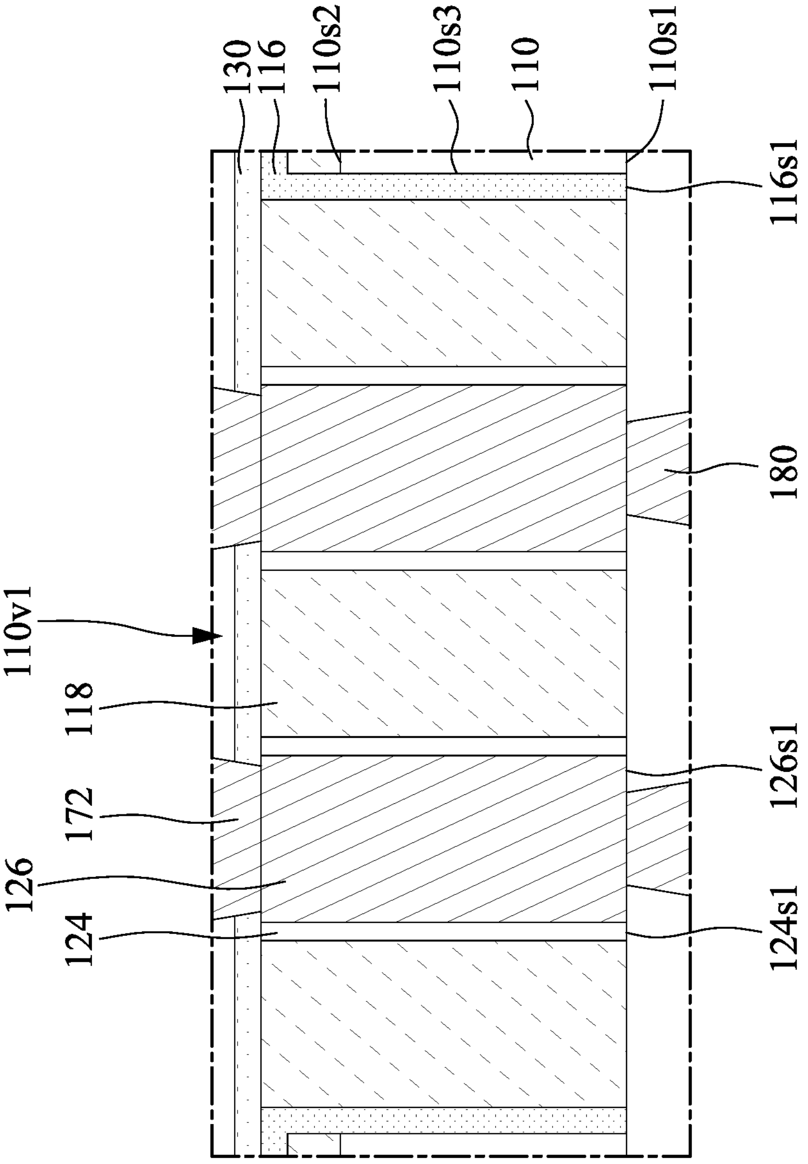
FIG. 1C is a partial enlarged view of the semiconductor device as shown in FIG. 1B, in accordance with some embodiments of the present disclosure.
Figure 1D:
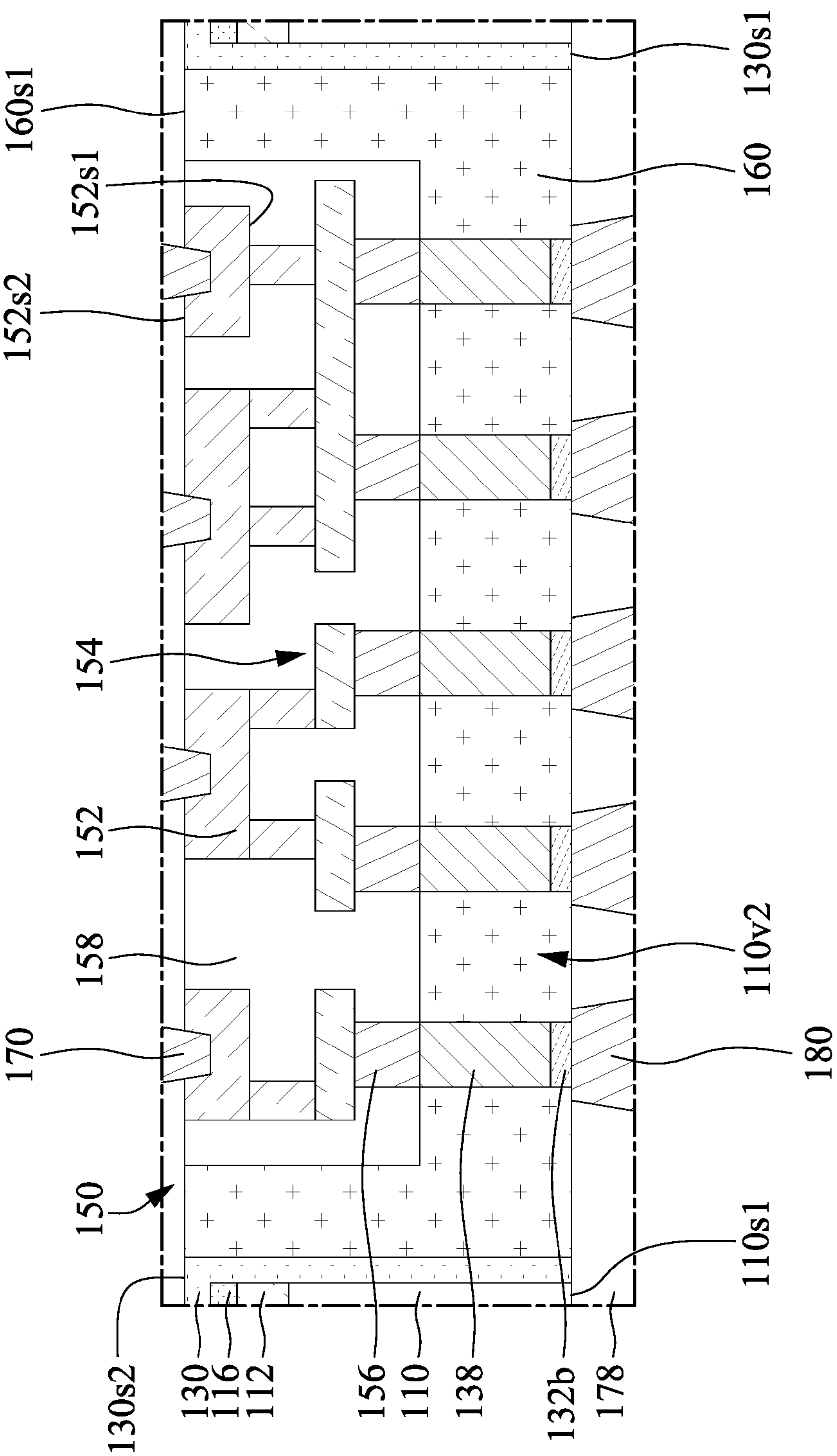
FIG. 1D is a partial enlarged view of the semiconductor device as shown in FIG. 1B, in accordance with some embodiments of the present disclosure.

FIG. 1B is a cross-sectional view along line A-A' of the semiconductor device 10, in accordance with some embodiments of the present disclosure. FIG. 1C and FIG. 1D are partial enlarged views of the regions 10*c* and region 10*b*, respectively.

The interposer 110 (or substrate) may have a surface 110*s*1 (or a lower surface) and a surface 110*s*2 (or an upper surface) opposite to the surface 110*s*1.

The semiconductor device 10 may include a dielectric layer 112 and a protection layer 116. In some embodiments, the dielectric layer 112 may be disposed on the surface 110*s*2 of the interposer 110. In some embodiments, the protection layer 116 may be disposed on the dielectric layer 112. The protection layer 116 may be spaced apart from the interposer 110 by the dielectric layer 112. The dielectric layer 112 and the protection layer 116 may have different materials. Each of the dielectric layer 112 and the protection layer 116 may include silicon oxide ($SiO_x$), silicon nitride ($Si_xN_y$), silicon oxynitride (SiON), or a combination thereof. In some embodiments, the dielectric layer 112 may include or be made of silicon oxide. In some embodiments, the protection layer 116 may include or be made of silicon nitride. In some embodiments, the protection layer 116 may function as a polishing stop layer (e.g., chemical mechanical polishing (CMP) stop layer) or an etching stop layer.

The interposer 110 may define a cavity 110*v*1. In some embodiments, the cavity 110*v*1 may extend between the surface 110*s*1 and the surface 110*s*2 of the interposer 110. The protection layer 116 may be disposed on a surface 110*s*3 of the interposer 110 within the cavity 110*v*1. In some embodiments, the protection layer 116 may be in contact with the surface 110*s*3 of the interposer 110 within the cavity 110*v*1.

As shown in FIG. 1C, the semiconductor device 10 may include an insulation layer 118. The insulation layer 118 may fill in the cavity 110*v*1 of the interposer 110. The insulation layer 118 may be spaced apart from the surface 110*s*3 of the interposer 110 by the protection layer 116. In some embodiments, the insulation layer 118 may penetrate the interposer 110. The insulation layer 118 may include silicon oxide, silicon nitride, silicon oxynitride, or a combination thereof. The insulation layer 118 and the protection layer 116 may include different materials. In some embodiments, the insulation layer 118 may include or be made of silicon oxide. The protection layer 116 may include a surface 116*s*1 (or a lower surface). In some embodiments, the surface 116*s*1 may be substantially coplanar with the surface 110*s*1 of the interposer 110.

The semiconductor device 10 may include a seed layer 124. The seed layer 124 may be disposed on a lateral surface of the insulation layer 118. The seed layer 124 may be spaced apart from the protection layer 116 by the insulation layer 118. The seed layer 124 may include conductive materials, such as tantalum nitride (TaN), titanium, titanium nitride (TiN), or other suitable materials. The seed layer 124 may include a surface 124*s*1 (or a lower surface). In some embodiments, the surface 124*s*1 may be substantially coplanar with the surface 110*s*1 of the interposer 110. In some embodiments, the surface 124*s*1 and the surface 116*s*1 may be located at the same elevation (or height).

The semiconductor device 10 may include a conductive via 126. The conductive via 126 may be disposed on a lateral surface of the seed layer 124. The conductive via 126 may be spaced apart from the insulation layer 118 by the seed layer 124. The protection layer 116 may be disposed between the conductive via 126 and the interposer 110. In some embodiments, the conductive via 126 may fully penetrate the interposer 110. The conductive via 126 may include conductive materials, such as copper (Cu), tungsten (W), silver (Ag), gold (Au), ruthenium (Ru), iridium (Ir), nickel (Ni), osmium (Os), rhodium (Rh), aluminum (Al), molybdenum (Mo), cobalt (Co), alloys thereof, combinations thereof or other suitable materials.

The conductive via 126 may include a surface 126*s*1 (or a lower surface). In some embodiments, the surface 126*s*1 may be substantially coplanar with the surface 124*s*1 of the seed layer 124. In some embodiments, the surface 126*s*1 and the surface 110*s*1 may be located at the same elevation (or height). In some embodiments, the conductive via 126 may also be referred as a through-insulation via (TIV), such as a through-oxide via (TOV).

Referring back to FIG. 1B, the semiconductor device 10 may include a protection layer 130. In some embodiments, the protection layer 130 may be disposed on the surface 110*s*2 of the interposer 110. In some embodiments, the protection layer 130 may be disposed on the dielectric layer 112. The protection layer 130 may be spaced apart from the interposer 110 by the dielectric layer 112. The protection layer 130 and the dielectric layer 112 may include different materials. The protection layer 130 may include silicon oxide ($SiO_x$), silicon nitride ($Si_xN_y$), silicon oxynitride (SiON), or other suitable materials. In some embodiments, the protection layer 130 may include or be made of silicon nitride. In some embodiments, the protection layer 130 may function as a polishing stop layer (e.g., CMP stop layer) or an etching stop layer. The protection layer 130 may include a surface 130*s*1 (or a lower surface) and a surface 130*s*2 (or an upper surface). In some embodiments, the surface 130*s*1 of the protection layer 130 may be substantially coplanar with the surface 110*s*1 of the interposer 110. In some embodiments, an elevation (or height) of the surface 130*s*1 of the protection layer 130 may be equal to that of the surface 116*s*1 of the protection layer 116. In some embodiments, an elevation (or height) of the surface 130*s*1 of the protection layer 130 may be equal to that of the surface 126*s*1 of the conductive via 126. In some embodiments, an elevation (or height) of the surface 130*s*1 of the protection layer 130 may be equal to that of the surface 124*s*1 of the seed layer 124.

The semiconductor device 10 may include a cavity 110*v*2. In some embodiments, the cavity 110*v*2 may extend between the surface 110*s*1 and the surface 110*s*2 of the interposer 110. The protection layer 130 may be disposed on a surface 110*s*4 of the interposer 110 within the cavity 110*v*2. In some embodiments, the protection layer 130 may be in contact with the surface 110*s*4 of the interposer 110 within the cavity 110*v*2.

As shown in FIG. 1D, the semiconductor device 10 may include electrical connections 132*b*. In some embodiments, the electrical connection 132*b* may be disposed on the bottom of the cavity 110*v*4. The electrical connection 132*b* may be exposed from the surface 110*s*1 of the interposer 110. The electrical connection 132*b* may include solder material, such as alloys of gold and tin solder or alloys of silver and tin solder.

The semiconductor device 10 may include conductive pillars 138. In some embodiments, the conductive pillar 138 may be disposed on the electrical connection 132*b*. The conductive pillar 138 may be electrically connected to the electrical connection 132*b*. In some embodiments, the conductive pillar 138 may include or be made of conductive materials, Cu, W, Ag, Au, Ru, Ir, Ni, Os, Rh, Al, Mo, Co, alloys thereof, combinations thereof or other suitable materials.

The semiconductor device 10 may include a package structure 150. In some embodiments, the package structure 150 may be disposed within the cavity 110v2. The package structure 150 may include a plurality of electronic components 152, a redistribution structure 154, a plurality of conductive pads 156, and an encapsulant 158.

Each of the electronic components 152 may include a memory device, such as a dynamic random access memory (DRAM) device, a one-time programming (OTP) memory device, a static random access memory (SRAM) device, or other suitable memory devices. In some embodiments, the electronic component 152 may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices. The electronic component 152 may have a surface 152s1 (or a lower surface) and a surface 152s2 (or an upper surface) opposite to the surface 152s1. The surface 152s1 may face the surface 110s1 of the interposer 110.

The redistribution structure 154 may include conductive pad(s), trace(s), via(s), layer(s), or other interconnection(s) therein. For example, the redistribution structure 154 may include one or more transmission lines (e.g., communications cables) and one or more grounding lines and/or grounding planes therein.

The conductive pad 156 may be electrically connected to the redistribution structure 154. The conductive pad 156 may be electrically connected to the conductive pillar 138. In some embodiments, the conductive pad 156 may be bonded to the conductive pillar 138. In some embodiments, the conductive pad 156 may be exposed from the encapsulant 158. In some embodiments, the conductive pad 156 may include or be made of conductive materials, Cu, W, Ag, Au, Ru, Ir, Ni, Os, Rh, Al, Mo, Co, alloys thereof, combinations thereof or other suitable materials.

In some embodiments, the encapsulant 158 may encapsulate the electronic components 152. The encapsulant 158 may encapsulate the conductive pads 156. In some embodiments, the encapsulant 158 may be made of molding material that may include, for example, a Novolac-based resin, an epoxy-based resin, a silicone-based resin, or other suitable encapsulant. Suitable fillers may also be included, such as powdered $SiO_2$.

The semiconductor device 10 may include an encapsulant 160. In some embodiments, the encapsulant 160 may be disposed within the cavity 110v2 of the interposer 110. In some embodiments, the encapsulant 160 may encapsulate the package structure 150. In some embodiments, the encapsulant 160 may encapsulate the electronic components 152. In some embodiments, the encapsulant 160 may encapsulate the encapsulant 158. In some embodiments, the encapsulant 160 may encapsulate the conductive pillars 138. In some embodiments, the encapsulant 160 may encapsulate the electrical connections 132b. In some embodiments, the encapsulant 160 may be in contact with the protection layer 130. In some embodiments, the encapsulant 160 may be spaced apart from the interposer 110 by the protection layer 130. In some embodiments, the encapsulant 160 may penetrate the interposer 110. In some embodiments, the encapsulant 160 may fully penetrate the interposer 110. In some embodiments, the encapsulant 160 may be made of molding material that may include, for example, a Novolac-based resin, an epoxy-based resin, a silicone-based resin, or other suitable encapsulant. Suitable fillers may also be included, such as powdered $SiO_2$. The encapsulant 160 may have a surface 160s1 (or upper surface). In some embodiments, the surface 160s1 of the encapsulant 160 may be substantially coplanar with the surface 130s2 of the protection layer 130.

Referring back to FIG. 1B, the semiconductor device 10 may include a dielectric layer 162. The dielectric layer 162 may be disposed on the surface 110s2 of the interposer 110. The dielectric layer 162 may be disposed on the protection layer 130. The dielectric layer 162 may be disposed on the encapsulant 160. The dielectric layer 162 may include a dielectric material such as silicon oxide, silicon nitride, silicon oxynitride, fluoride-doped silicate (FSG), a low-k dielectric material, combinations thereof, and/or other suitable materials. In some embodiments, the material of the dielectric layer 162 may be the same as that of the protection layer 130.

The semiconductor device 10 may include conductive elements 170. In some embodiments, the conductive element 170 may penetrate the dielectric layer 162. In some embodiments, the conductive element 170 may penetrate a portion of the electronic component 152. In some embodiments, the conductive element 170 may penetrate the electronic component 152 from the surface 152s2. In some embodiments, the conductive element 170 may be electrically connected to the electronic component 152. In some embodiments, the conductive element 170 may be tapered toward the interposer 110. The conductive element 170 may include or be made of conductive materials, Cu, W, Ag, Au, Ru, Ir, Ni, Os, Rh, Al, Mo, Co, alloys thereof, combinations thereof or other suitable materials.

The semiconductor device 10 may include conductive elements 172. In some embodiments, the conductive element 172 may penetrate the dielectric layer 162. In some embodiments, the conductive element 172 may penetrate the protection layer 130. In some embodiments, the conductive element 172 may be electrically connected to the conductive via 126. In some embodiments, the conductive element 172 may be tapered toward the interposer 110. In some embodiments, the conductive elements 170 and 172 may be located at the same elevation (or height). In some embodiments, the conductive elements 170 and 172 may have different dimensions (e.g., length, width, or area). The conductive element 172 may include or be made of conductive materials, Cu, W, Ag, Au, Ru, Ir, Ni, Os, Rh, Al, Mo, Co, alloys thereof, combinations thereof or other suitable materials.

The semiconductor device 10 may include a passivation layer 178. The passivation layer 178 may be disposed on the surface 110s1 of the interposer 110. The passivation layer 178 may include a dielectric material, such as polyimide-isoindoloquinazolinedione (PIQ), polybenzoxazole (PBO), benzocyclobutene (BCB), or other suitable materials.

The semiconductor device 10 may include conductive elements 180. In some embodiments, the conductive element 180 may penetrate the passivation layer 178. In some embodiments, the conductive element 180 may be disposed on the surface 110s1 of the interposer 110. In some embodiments, the conductive element 180 may be electrically connected to the electrical connection 132b. In some embodiments, the conductive element 180 may be electrically connected to the conductive via 126. In some embodiments, the conductive element 180 may be tapered toward the interposer 110. The conductive element 180 may include or be made of conductive materials, Cu, W, Ag, Au, Ru, Ir, Ni, Os, Rh, Al, Mo, Co, alloys thereof, combinations thereof or other suitable materials.

The semiconductor device 10 may include electrical connections 182. The electrical connection 182 may be electrically connected to the conductive element 180. The electrical connection 182 may include solder material, such as alloys of gold and tin solder or alloys of silver and tin solder.

The semiconductor device 10 may include electronic components 186*a* and 186*b*. In some embodiments, the electronic components 186*a* and 186*b* may be disposed on the region 10*a*. In some embodiments, the electronic components 186*a* and 186*b* may be disposed on the surface 110*s*2 of the interposer 110. In some embodiments, the electronic components 186*a* and 186*b* may be free from overlapping the cavities 110*v*1 and 110*v*2. The electronic component 186*a* may be attached to the surface 110*s*2 through an adhesive layer 187. In some embodiments, the active surface (not annotated) of the electronic component 186*a* (or 186*b*) may face away from the interposer 110. Each of the electronic components 186*a* and 186*b* may include a memory device, such as a dynamic random access memory (DRAM) device, a one-time programming (OTP) memory device, a static random access memory (SRAM) device, or other suitable memory devices. In some embodiments, each of the electronic components 186*a* and 186*b* may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 10 may include electronic components 188*a* and 188*b*. In some embodiments, the electronic components 188*a* and 188*b* may be disposed on the surface 110*s*2 of the interposer 110. In some embodiments, the electronic component 188*a* may be disposed on or above the region 10*b*. In some embodiments, the electronic component 188*a* may be electrically connected to the electronic component 152. In some embodiments, the electronic component 188*a* may be disposed directly above the package structure 150. In some embodiments, the electronic component 188*b* may be disposed on or above the region 10*c*. In some embodiments, the electronic component 188*b* may be electrically connected to the conductive via 126. In some embodiments, the electronic component 188*b* may be disposed directly over the conductive via 126. In some embodiments, the active surface (not annotated) of the electronic component 188*a* (or 188*b*) may face the interposer 110. Each of the electronic components 188*a* and 188*b* may include a memory device, such as a dynamic random access memory (DRAM) device, a one-time programming (OTP) memory device, a static random access memory (SRAM) device, or other suitable memory devices. In some embodiments, each of the electronic components 188*a* and 188*b* may include a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 10 may include a passivation layer 189. The passivation layer 189 may be disposed on the active surface of the electronic component 188*a* (or 188*b*). The passivation layer 189 may include a dielectric material such as PIQ, PBO, BCB, or other suitable materials.

The semiconductor device 10 may include conductive elements 190. In some embodiments, the conductive element 190 may be electrically connected to the electronic component 188*a* (or 188*b*). In some embodiments, the conductive element 190 may be electrically connected to the conductive element 170. The conductive element 190 may penetrate the passivation layer 189. The conductive element 190 may include or be made of conductive materials, Cu, W, Ag, Au, Ru, Ir, Ni, Os, Rh, Al, Mo, Co, alloys thereof, combinations thereof or other suitable materials.

The semiconductor device 10 may include a mother board 194. The mother board 194 may be disposed on the surface 110*s*1 of the interposer 110. The mother board 194 may be electrically connected to the electronic component 188*a* through the package structure 150. The mother board 194 may be electrically connected to the electronic component 188*b* through the conductive via 126. The mother board 194 may be electrically connected to the electronic component 186*a* (or 186*b*). The mother board 194 may be formed of, for example, a printed circuit board, such as a paper-based copper foil laminate, a composite copper foil laminate, or a polymer-impregnated glass-fiber-based copper foil laminate. The mother board 194 may include a redistribution layer (RDL) or traces for electrical connection between components. The mother board 194 may have a surface 194*s*1 (or a lower surface) and a surface 194*s*2 (or an upper surface) opposite to the surface 194*s*1. The surface 194*s*2 of the mother board 194 may face the interposer 110.

The semiconductor device 10 may include electrical connections 196. The electrical connections 196 may be disposed on the surface 194*s*1 of the mother board 194. Each of the electrical connections 196 may be electrically connected to an external device (not shown). The electrical connection 196 may include solder material, such as alloys of gold and tin solder or alloys of silver and tin solder.

The semiconductor device 10 may include conductive wires 198. In some embodiments, the conductive wire 198 may be configured to electrically connect the electronic component 186*a* (or 186*b*) to the mother board 194. The conductive wire 198 may be connected to the surface 194*s*2 of the mother board 194.

In a comparative semiconductor device, a TSV is disposed within an interposer to electrically connect devices on opposite surfaces of the interposer. When the size of the semiconductor device is reduced, it becomes more difficult to control the depth of the TSV. Further, the parasitic capacitance of the TSV may adversely affect the performance of the semiconductor device. In this embodiment, the semiconductor device 10 includes a TIV (e.g., conductive via 126). The TIV may penetrate the interposer. The TIV has a relatively small parasitic capacitance in comparison with a TSV. Further the depth of the TIV may be controlled by determining the depth of the cavity (e.g., 110*v*1), and the protection layer (e.g., 116) may prevent the interposer 110 from being over polished. As a result, the depth of the TIV may relatively well controlled in comparison with the TSV.

Figure 2:
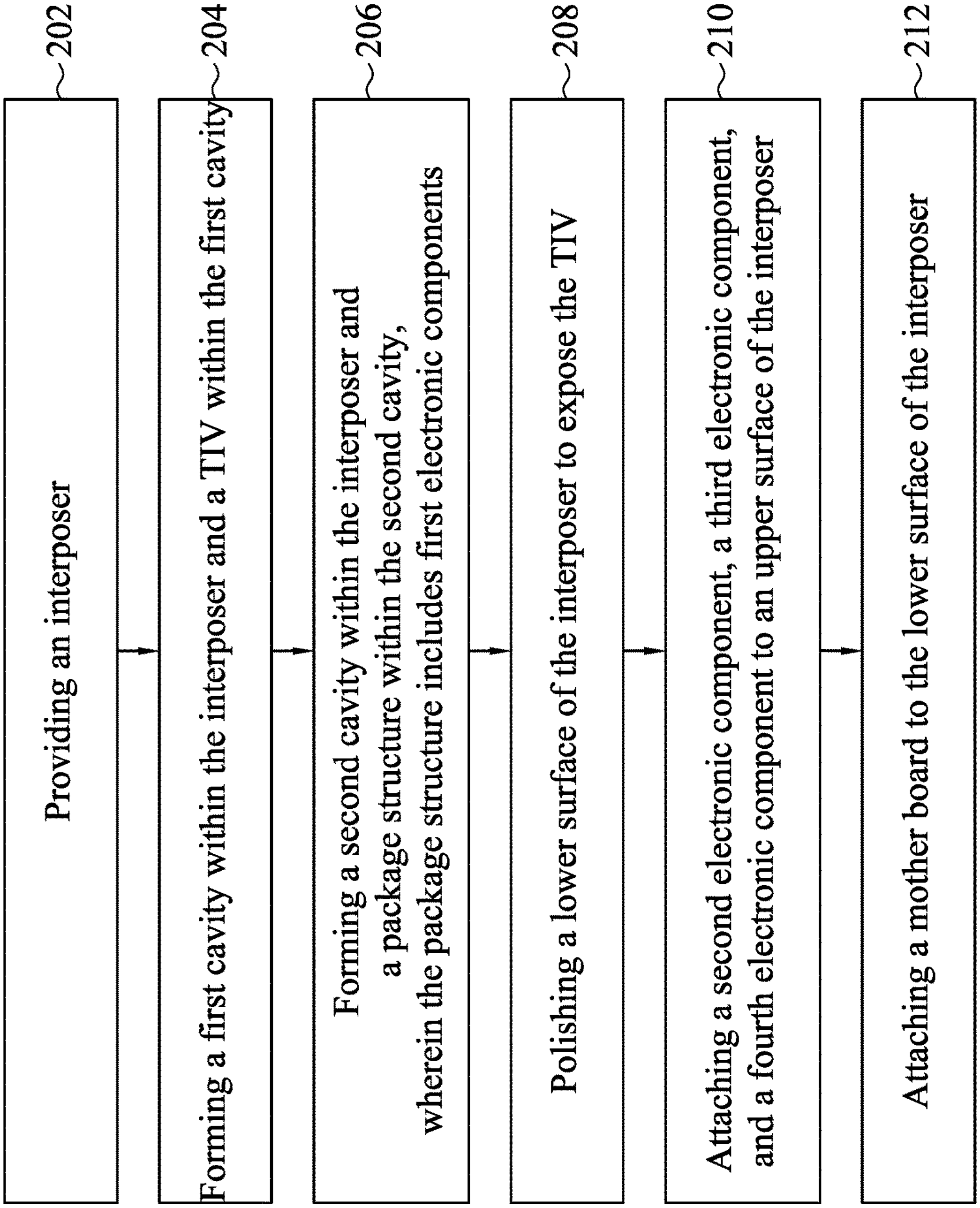
FIG. 2 is a flowchart illustrating a method of manufacturing a semiconductor device, in accordance with various aspects of the present disclosure.

FIG. 2 is a flowchart illustrating a method 20 of manufacturing a semiconductor device, in accordance with various aspects of the present disclosure.

The method 20 begins with operation 202 in which an interposer is provided. The interposer has a lower surface and an upper surface.

The method 20 continues with operation 204 in which a first cavity may be formed within the interposer. A first protection layer may be formed within the first cavity. A TIV may be formed within the first cavity.

The method 20 continues with operation 206 in which a second cavity may be formed within the interposer. A second protection layer may be formed within the second cavity. A package structure, including first electronic components, may be disposed within the second cavity.

The method 20 continues with operation 208 in which a polishing technique may be performed to remove a portion of the lower surface of the interposer, the first protection layer, and the second protection layer to expose the TIV.

The method 20 continues with operation 210 in which a second electronic component, a third electronic component, and a fourth electronic component are attached to the upper surface of the interposer. The second electronic component may be electrically connected to the TIV. The third electronic component may be electrically connected to the package structure.

The method 20 continues with operation 212 in which a mother board is attached to the lower surface of the interposer. A conductive wire is formed to electrically connect the fourth electronic component and the mother board.

The method 20 is merely an example, and is not intended to limit the present disclosure beyond what is explicitly recited in the claims. Additional operations can be provided before, during, or after each operation of the method 20, and some operations described can be replaced, eliminated, or reordered for additional embodiments of the method. In some embodiments, the method 20 can include further operations not depicted in FIG. 2. In some embodiments, the method 20 can include one or more operations depicted in FIG. 2.

Figure 3:
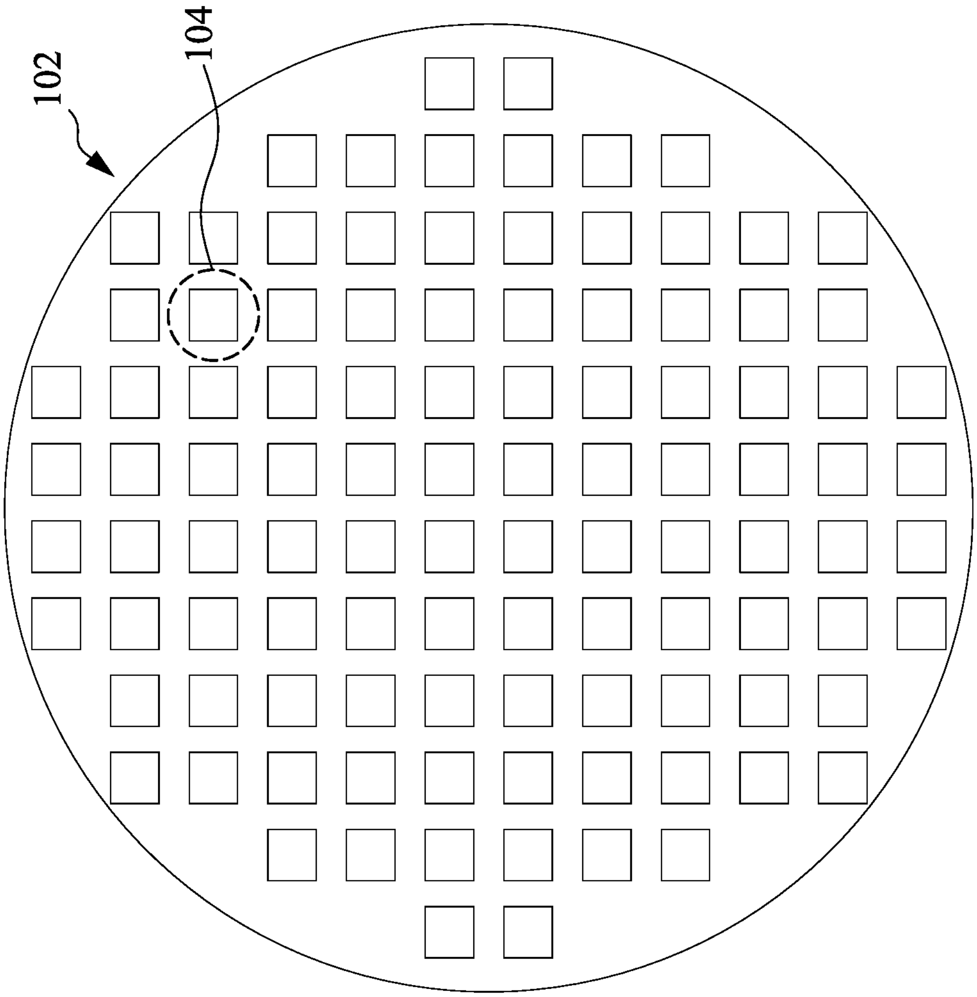
FIG. 3 is a top view of a wafer, in accordance with some embodiments of the present disclosure.

FIG. 3 is a top view of a wafer, in accordance with some embodiments of the present disclosure. The wafer 102 may be sawed along scribe lines into a plurality of regions 104. Each of the regions 104 may correspond to a semiconductor die after the wafer 102 is sawed. The region 104 may include a substrate (or an interposer), and a plurality of active components and/or passive components may be attached to or formed on the substrate. The active component may include a memory die (e.g., dynamic random access memory (DRAM) die, a static random access memory (SRAM) die, etc.)), a power management die (e.g., power management integrated circuit (PMIC) die)), a logic die (e.g., system-on-a-chip (SoC), central processing unit (CPU), graphics processing unit (GPU), application processor (AP), microcontroller, etc.)), a radio frequency (RF) die, a sensor die, a micro-electro-mechanical-system (MEMS) die, a signal processing die (e.g., digital signal processing (DSP) die)), a front-end die (e.g., analog front-end (AFE) dies)) or other active components. The passive component may include a capacitor, a resistor, an inductor, a fuse or other passive components.

Figure 25:
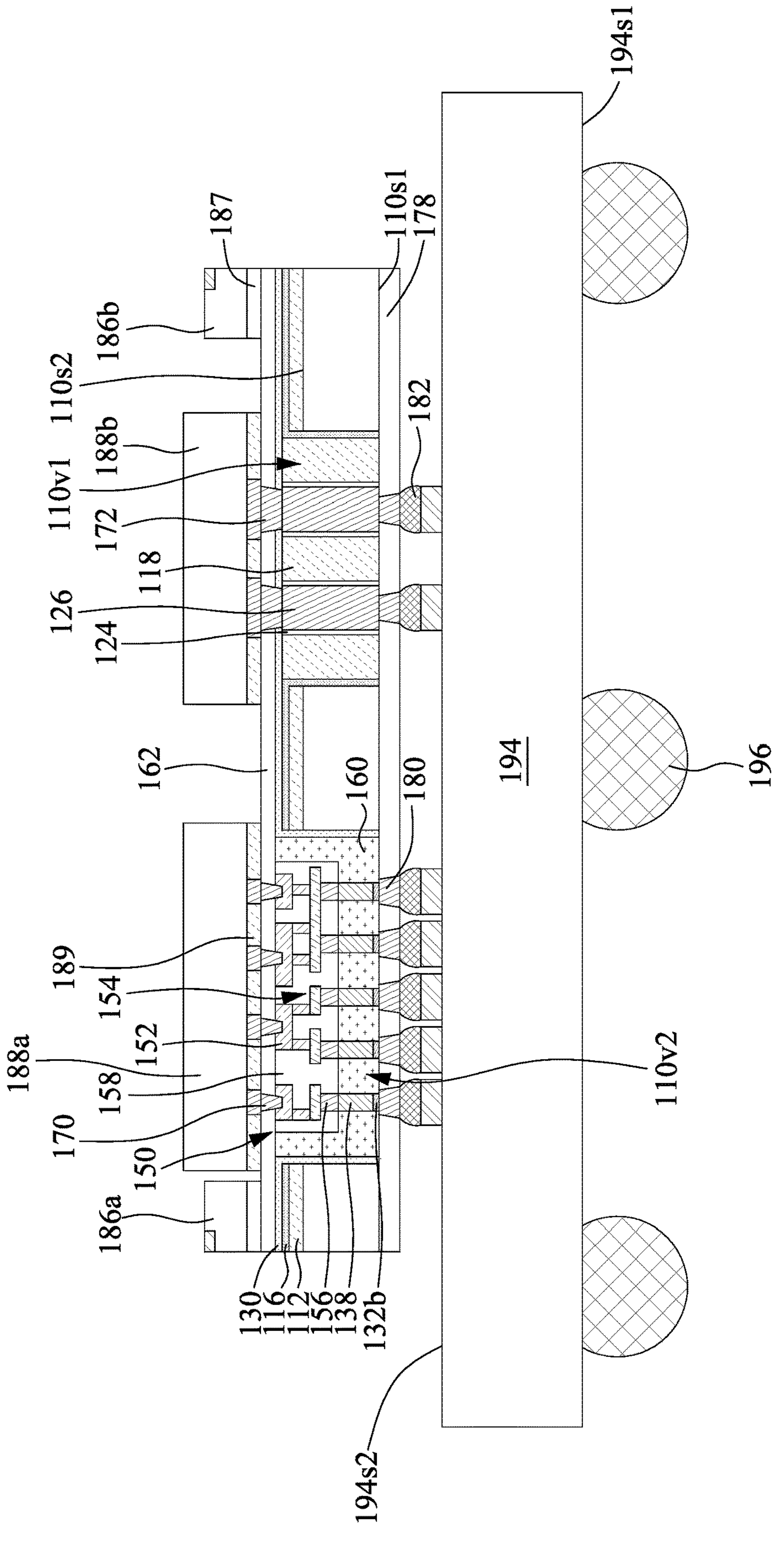
FIG. 25 illustrates one or more various stages of manufacturing a semiconductor device, in accordance with some embodiments of the present disclosure.
Figure 26:
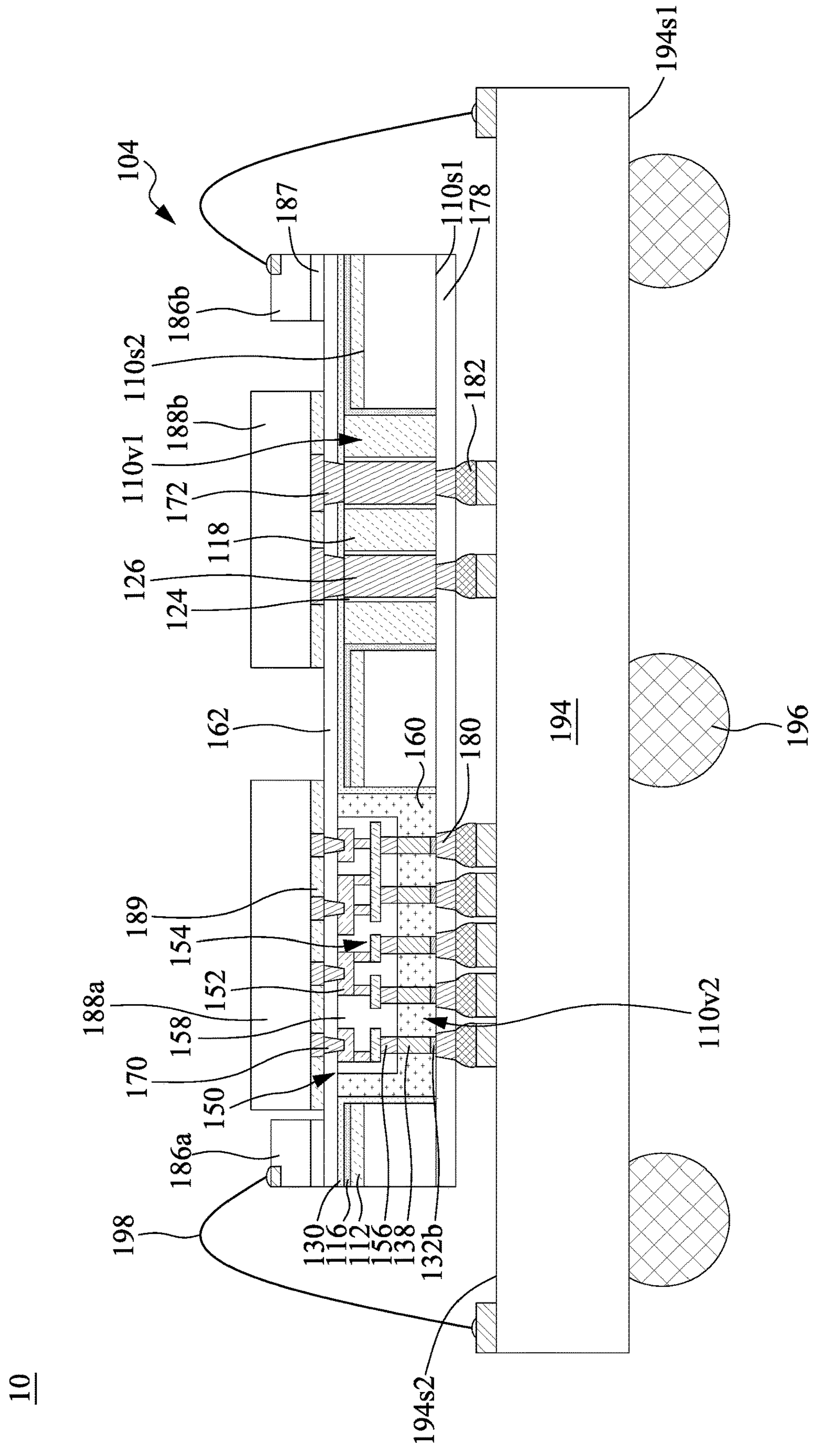
FIG. 26 illustrates one or more various stages of manufacturing a semiconductor device, in accordance with some embodiments of the present disclosure.

FIG. 4 to FIG. 26 illustrate one or more various stages of manufacturing a semiconductor device 10 as shown in FIG. 1B, in accordance with some embodiments of the present disclosure. FIG. 4 to FIG. 24 illustrate cross-sectional views of the region 104 at the stages before the wafer 102 is sawed. FIG. 25 and FIG. 26 illustrate cross-sectional views of the region 104 at the stages after the wafer 102 is sawed.

Figure 4:
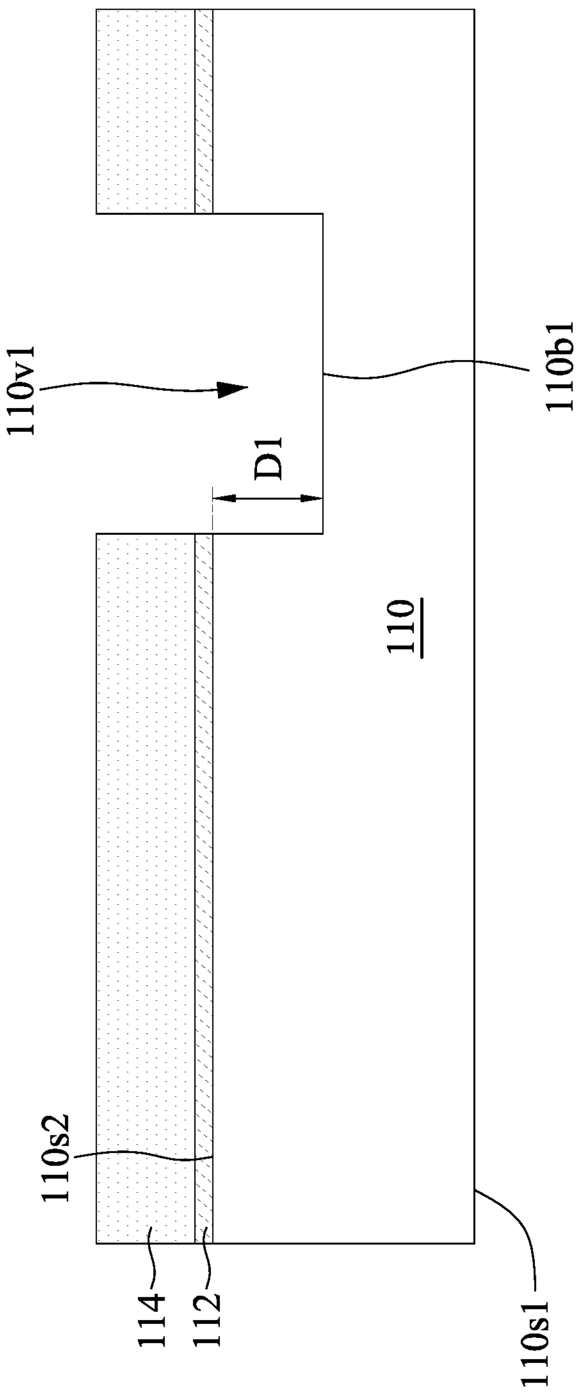
FIG. 4 illustrates one or more various stages of manufacturing a semiconductor device, in accordance with some embodiments of the present disclosure.

Referring to FIG. 4, an interposer 110 may be provided. The interposer 110 may have a surface **110*s*1 and a surface 110*s*2. In some embodiments, a dielectric layer 112 may be formed on the surface 110*s*2 of the interposer 110. The dielectric layer 112 may be formed by chemical vapor deposition (CVD), atomic layer deposition (ALD), physical vapor deposition (PVD), or other suitable techniques. In some embodiments, a mask 114 may be formed on the dielectric layer 112. The mask 114 may include a positive-tone or negative-tone photoresist such as a polymer. The mask 114 may be patterned to have an opening, which may be configured to define a cavity 110*v*1 of the interposer 110. In some embodiments, a photolithography technique and an etching technique may be performed to remove a portion of the interposer 110. In some embodiments, the cavity 110*v*1 may be recessed from the surface 110*s*2 of the interposer 110. The cavity 110*v*1 may have a depth D1 between the surface 110*s*2 of the interposer 110 and the bottom 110*b*1 of the cavity 110*v*1**.

Figure 5:
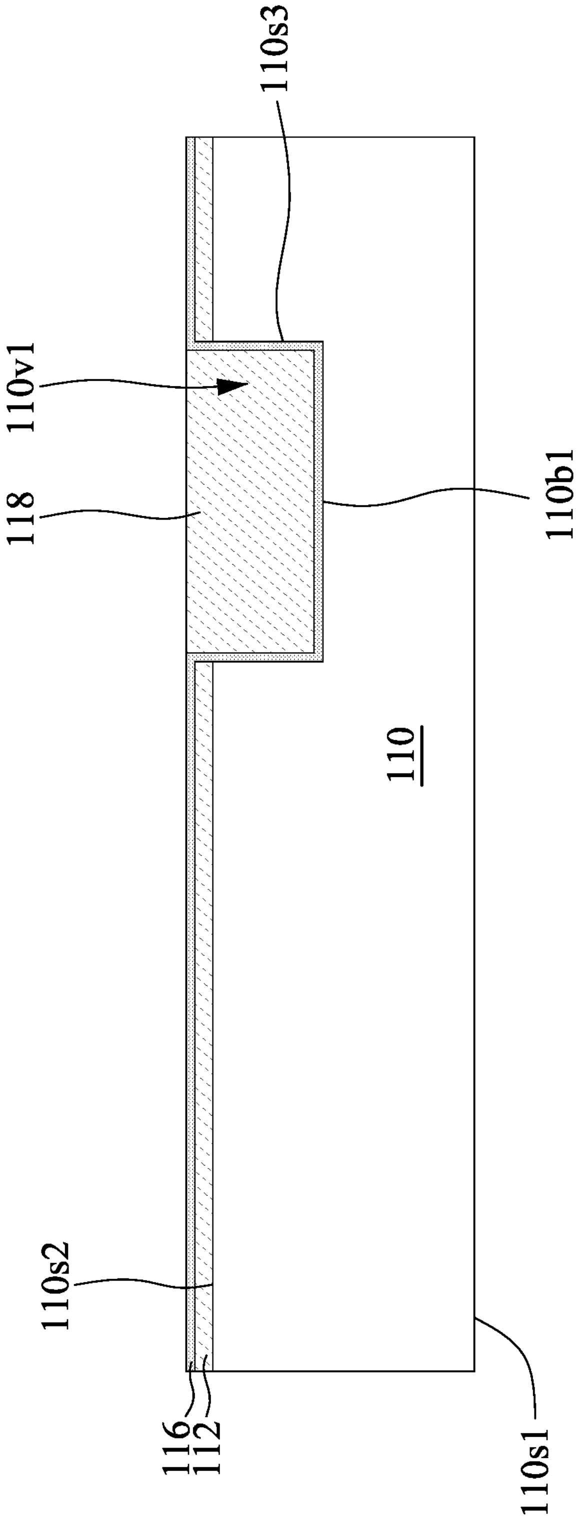
FIG. 5 illustrates one or more various stages of manufacturing a semiconductor device, in accordance with some embodiments of the present disclosure.

Referring to FIG. 5, the mask 114 may be removed, and a protection layer 116 may be formed on the dielectric layer 112. The protection layer 116 may be formed on the surface **110*s*2 of the interposer 110. The protection layer 116 may be formed on the surface 110*s*3 of the interposer 110. The protection layer 116 may be formed on the bottom 110*b*1 of the cavity 110*v*1. An insulation layer 118 may be formed on the protection layer 116 and fill the cavity 110*v*1. Each of the protection layer 116 and insulation layer 118 may be formed by CVD, ALD, PVD, or other suitable techniques. In some embodiments, a polishing technique, such as a chemical mechanical polishing (CMP) may be performed on the insulation layer 118 to expose the protection layer 116**.

Figure 6:
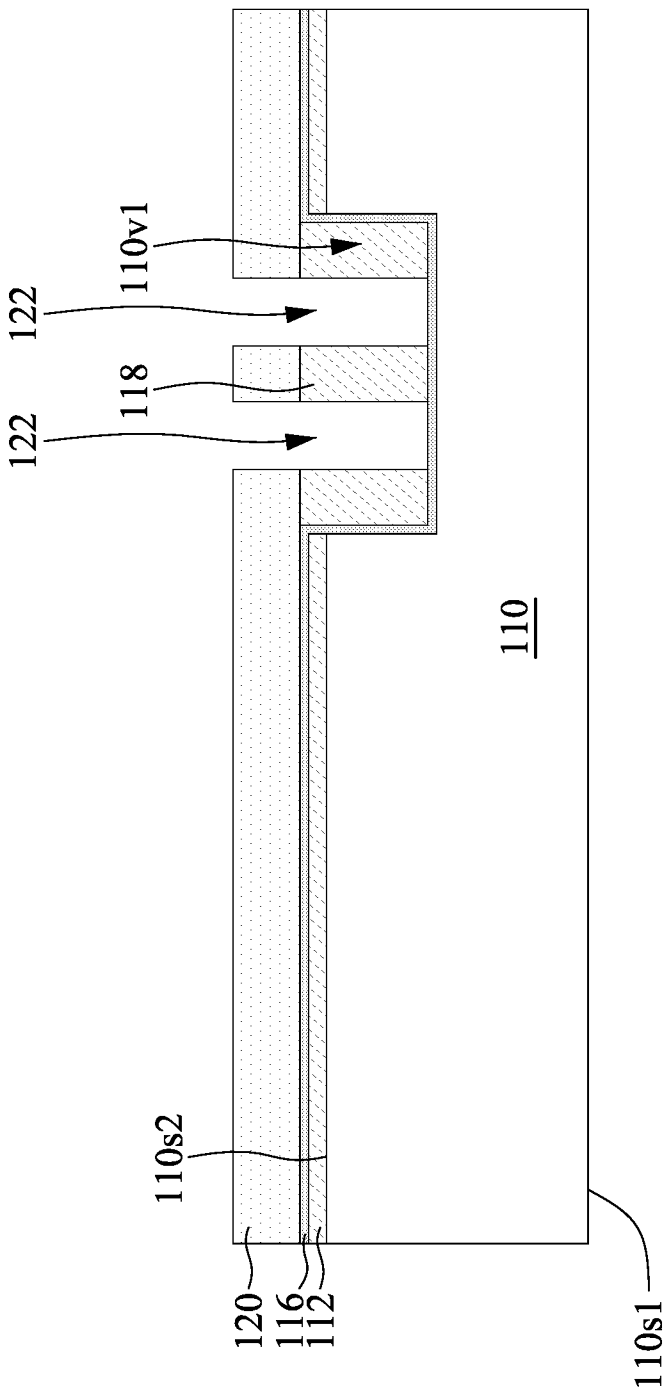
FIG. 6 illustrates one or more various stages of manufacturing a semiconductor device, in accordance with some embodiments of the present disclosure.

Referring to FIG. 6, a mask 120 may be formed over the protection layer 116 and the insulation layer 118. The mask 120 may include a positive-tone or negative-tone photoresist such as a polymer. The mask 120 may be patterned to form openings 122. Each of the openings 122 may penetrate the insulation layer 118. The opening 122 may be configured to define the region of a TIV or a TOV.

Figure 7:
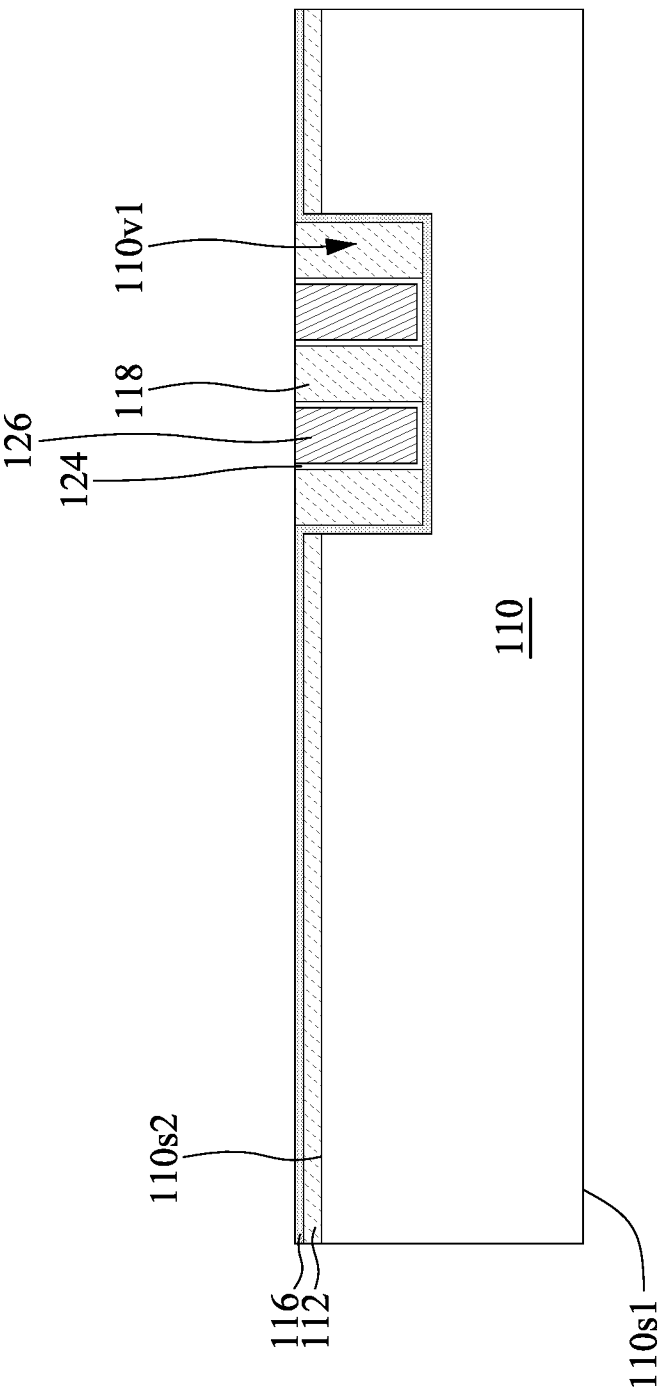
FIG. 7 illustrates one or more various stages of manufacturing a semiconductor device, in accordance with some embodiments of the present disclosure.

Referring to FIG. 7, a seed layer 124 may be formed within the opening 122 as shown in FIG. 6. The seed layer 124 may be in contact with the insulation layer 118. The conductive via 126 may be formed within the 122 as shown in FIG. 6. The conductive via 126 may be formed on the seed layer 124. Each of the 122 and the seed layer 124 may be formed by CVD, ALD, PVD, electroplating, or other suitable techniques. In some embodiments, the conductive via 126 and the insulation layer 118 may define a TIV. In some embodiments, the conductive via 126 is made of silicon oxide, and the conductive via 126 and the insulation layer 118 define a TOV.

Figure 8:
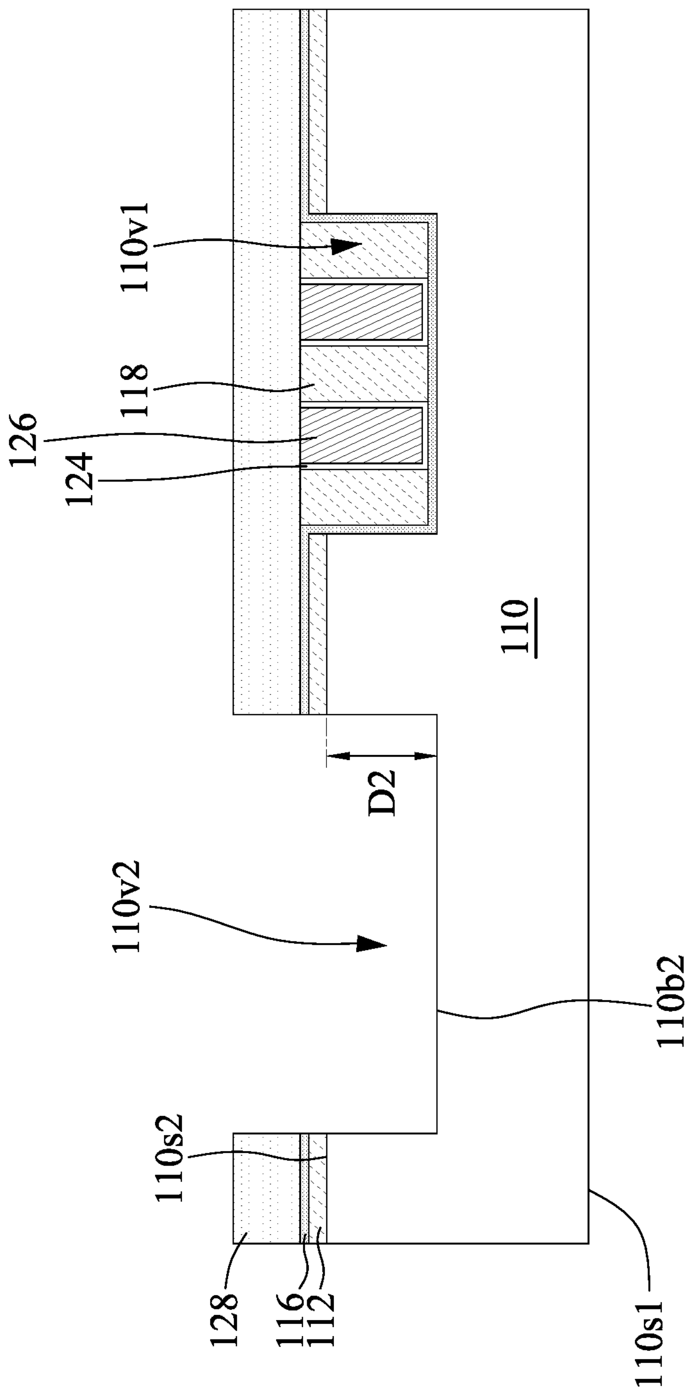
FIG. 8 illustrates one or more various stages of manufacturing a semiconductor device, in accordance with some embodiments of the present disclosure.

Referring to FIG. 8, a mask 128 may be formed on the protection layer 116. The mask 128 may cover the conductive via 126. The mask 128 may include a positive-tone or negative-tone photoresist such as a polymer. The mask 128 may be patterned to have an opening, which may be configured to define a cavity **110*v*2 of the interposer 110. In some embodiments, a photolithography technique and an etching technique may be performed to remove a portion of the interposer 110 to form the cavity 110*v*2. In some embodiments, the cavity 110*v*2 may be recessed from the surface 110*s*2 of the interposer 110. The cavity 110*v*2 may have a depth D2 between the surface 110*s*2 and the bottom 110*b*2 of the cavity 110*v*2**. In some embodiments, the depth D1 may be substantially equal to the depth D2.

Figure 9:
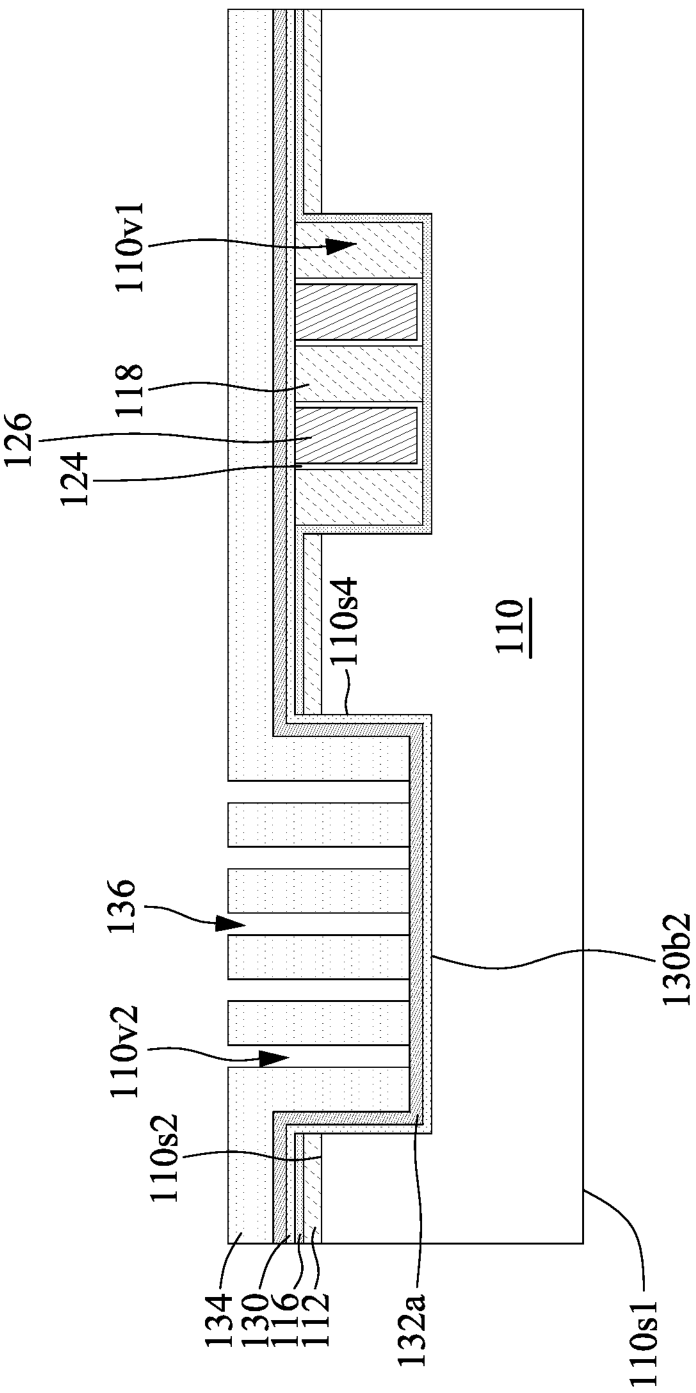
FIG. 9 illustrates one or more various stages of manufacturing a semiconductor device, in accordance with some embodiments of the present disclosure.

Referring to FIG. 9, the mask 128 may be removed, and a protection layer 130 may be formed on the protection layer 116. The protection layer 130 may be formed on the surface **110*s*2 of the interposer 110. The protection layer 130 may be formed on the surface 110*s*4 of the interposer 110. The protection layer 130 may be formed on the bottom 110*b*2 of the cavity 110*v*2. A conductive material 132*a* may be formed to fill the cavity 110*v*2. The conductive material 132*a* may include solder materials, such as alloys of gold and tin solder or alloys of silver and tin solder. The protection layer 130 may be formed by CVD, ALD, PVD, or other suitable techniques. The conductive material 132*a* may be formed by, for example, a coating technique, or other suitable techniques. A mask 134 may be formed on the conductive material 132*a*. The mask 134 may cover the conductive via 126. The mask 134 may include a positive-tone or negative-tone photoresist such as a polymer. The mask 134 may be patterned to have openings 136. In some embodiments, the openings 136 may be located on or within the cavity 110*v*2**.

Figure 10:
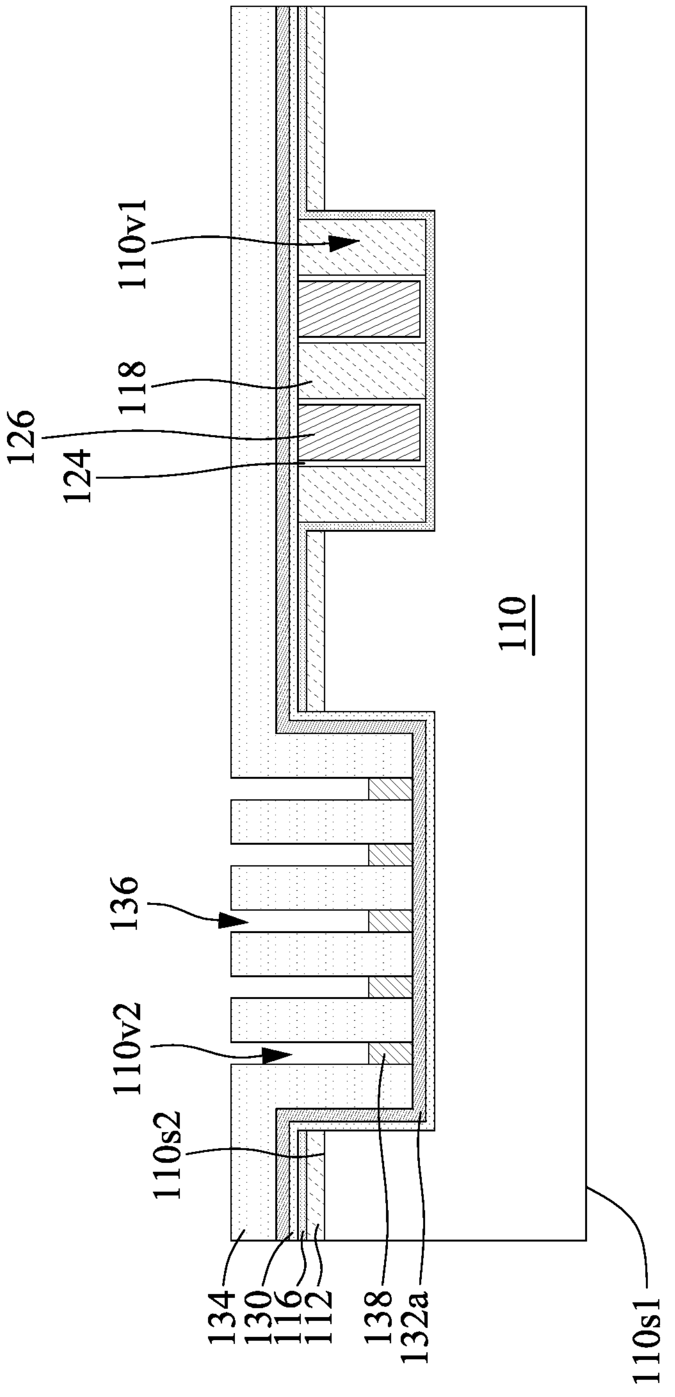
FIG. 10 illustrates one or more various stages of manufacturing a semiconductor device, in accordance with some embodiments of the present disclosure.

Referring to FIG. 10, conductive pillars 138 may be formed within the 136. In some embodiments, the conductive pillars 138 may be formed within the cavity 110*v*2. The conductive pillar 138 may be formed by CVD, ALD, PVD, electroplating, or other suitable techniques.

Figure 11:
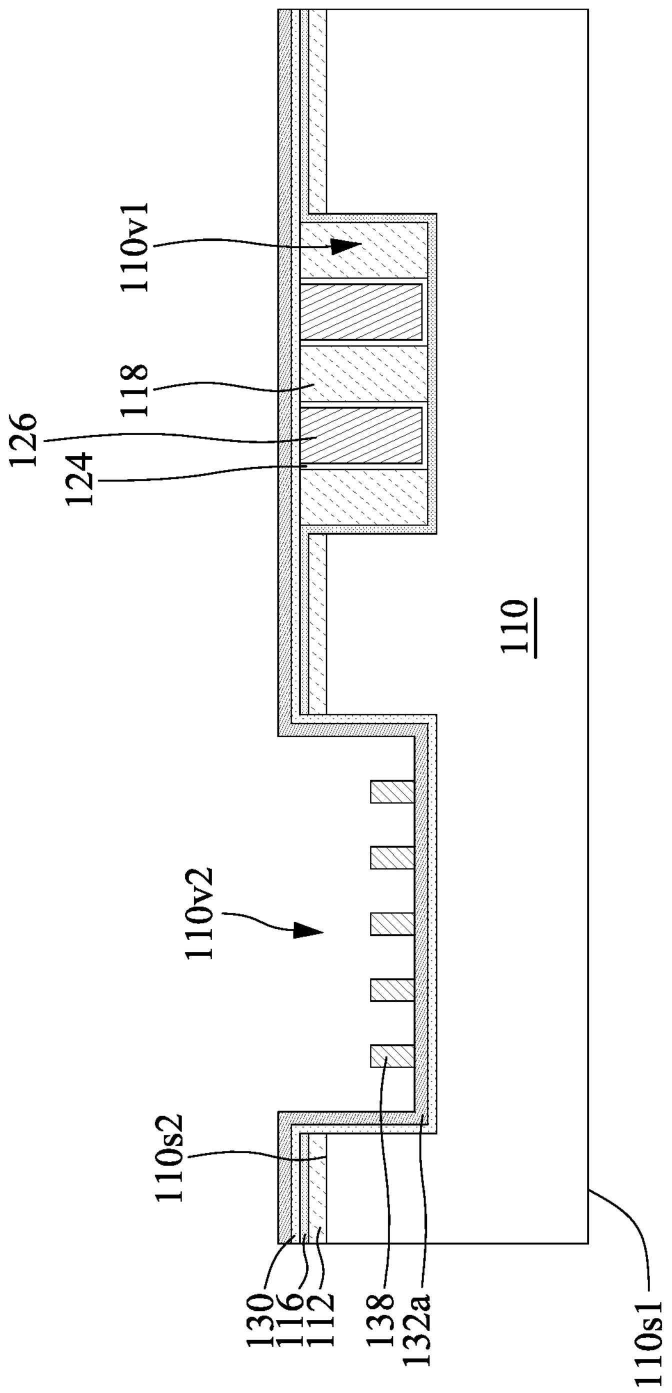
FIG. 11 illustrates one or more various stages of manufacturing a semiconductor device, in accordance with some embodiments of the present disclosure.

Referring to FIG. 11, the mask 134 may be removed. The conductive material 132*a* may be exposed.

Figure 12:
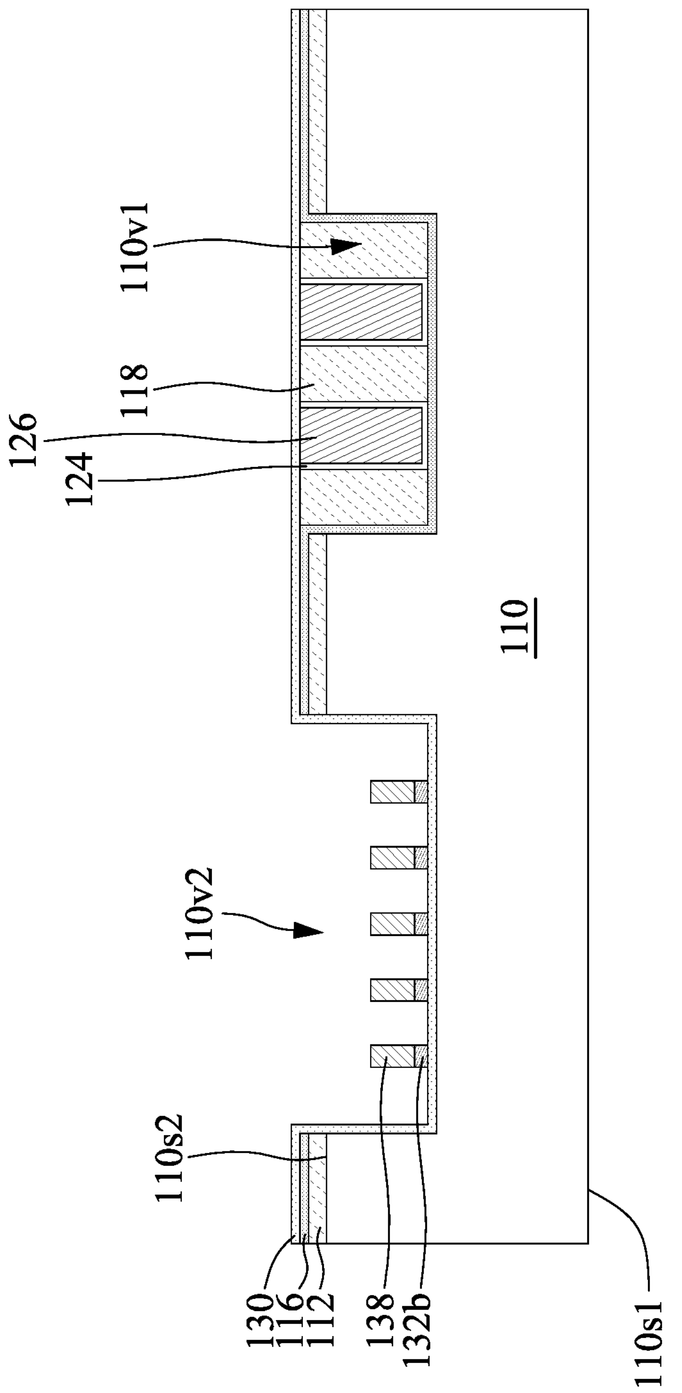
FIG. 12 illustrates one or more various stages of manufacturing a semiconductor device, in accordance with some embodiments of the present disclosure.

Referring to FIG. 12, the conductive material 132*a* exposed from the conductive pillar 138 may be removed, and the electrical connections 132*b* may be formed on the protection layer 130.

Figure 13:
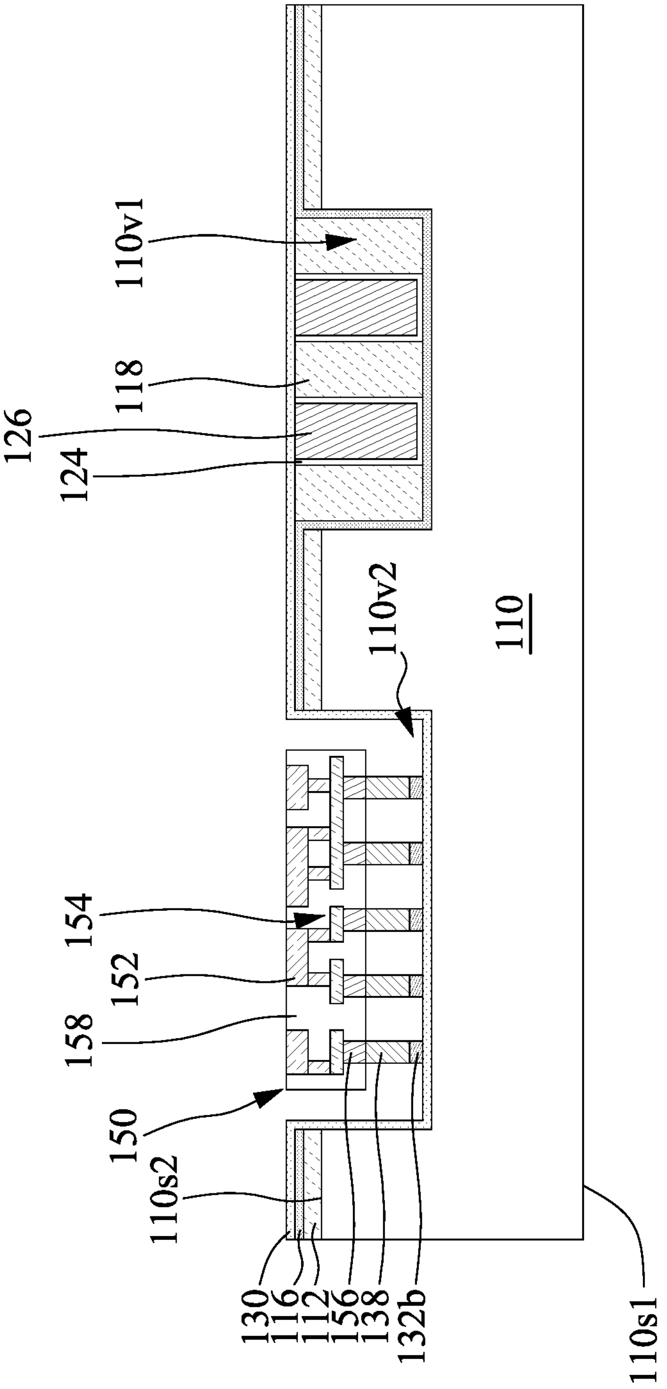
FIG. 13 illustrates one or more various stages of manufacturing a semiconductor device, in accordance with some embodiments of the present disclosure.

Referring to FIG. 13, a package structure 150 may be attached to the conductive pillar 138. In some embodiments, the package structure 150 may be disposed within the cavity 110*v*2 of the interposer 110. The package structure 150 may include a plurality of electronic components 152, a redistribution structure 154, a plurality of conductive pads 156, and an encapsulant 158 encapsulating the electronic component 152, the redistribution structure 154, and the conductive pads 156. In some embodiments, the conductive pads 156 may be bonded to the conductive pillars 138.

Figure 14:
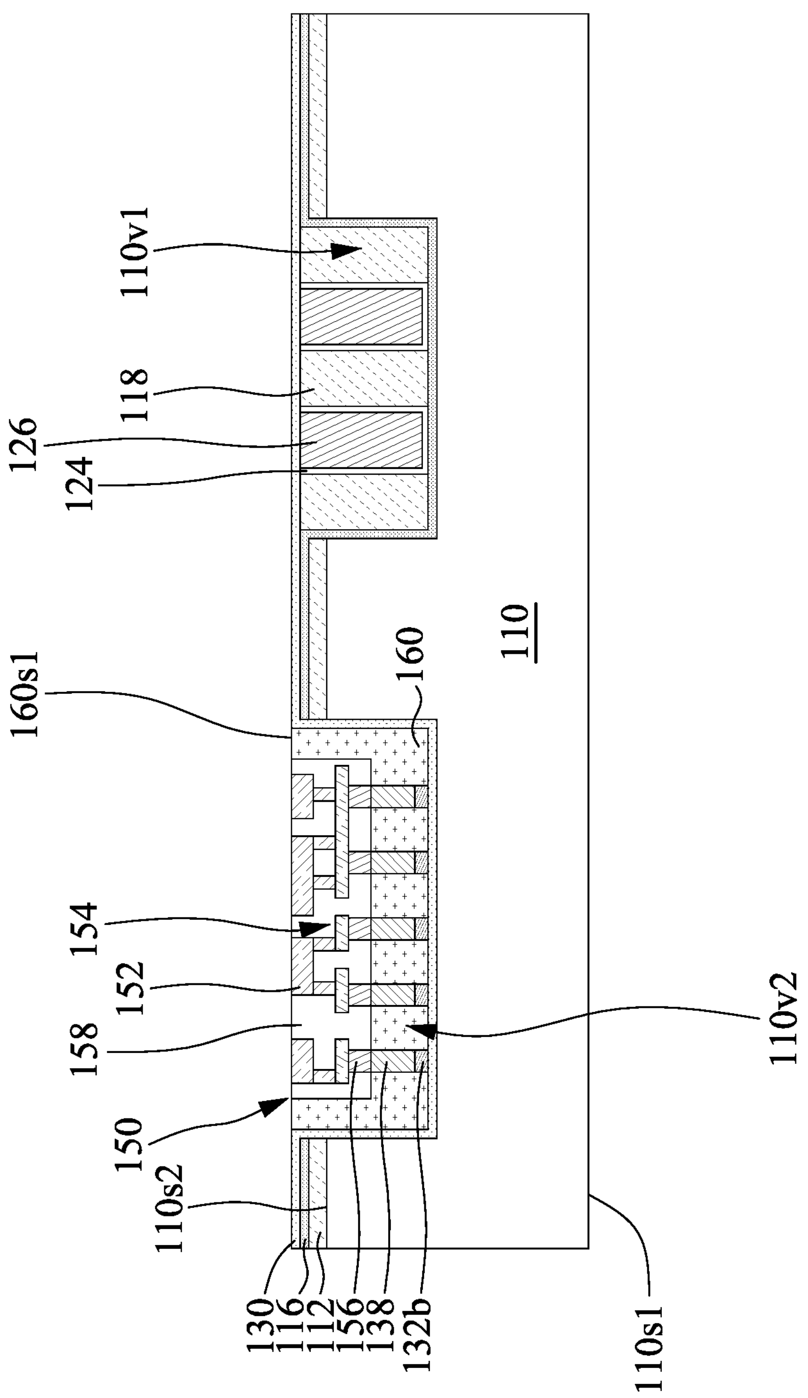
FIG. 14 illustrates one or more various stages of manufacturing a semiconductor device, in accordance with some embodiments of the present disclosure.

Referring to FIG. 14, an encapsulant 160 may be formed within the cavity 110*v*2 to encapsulate the package structure 150.

Figure 15:
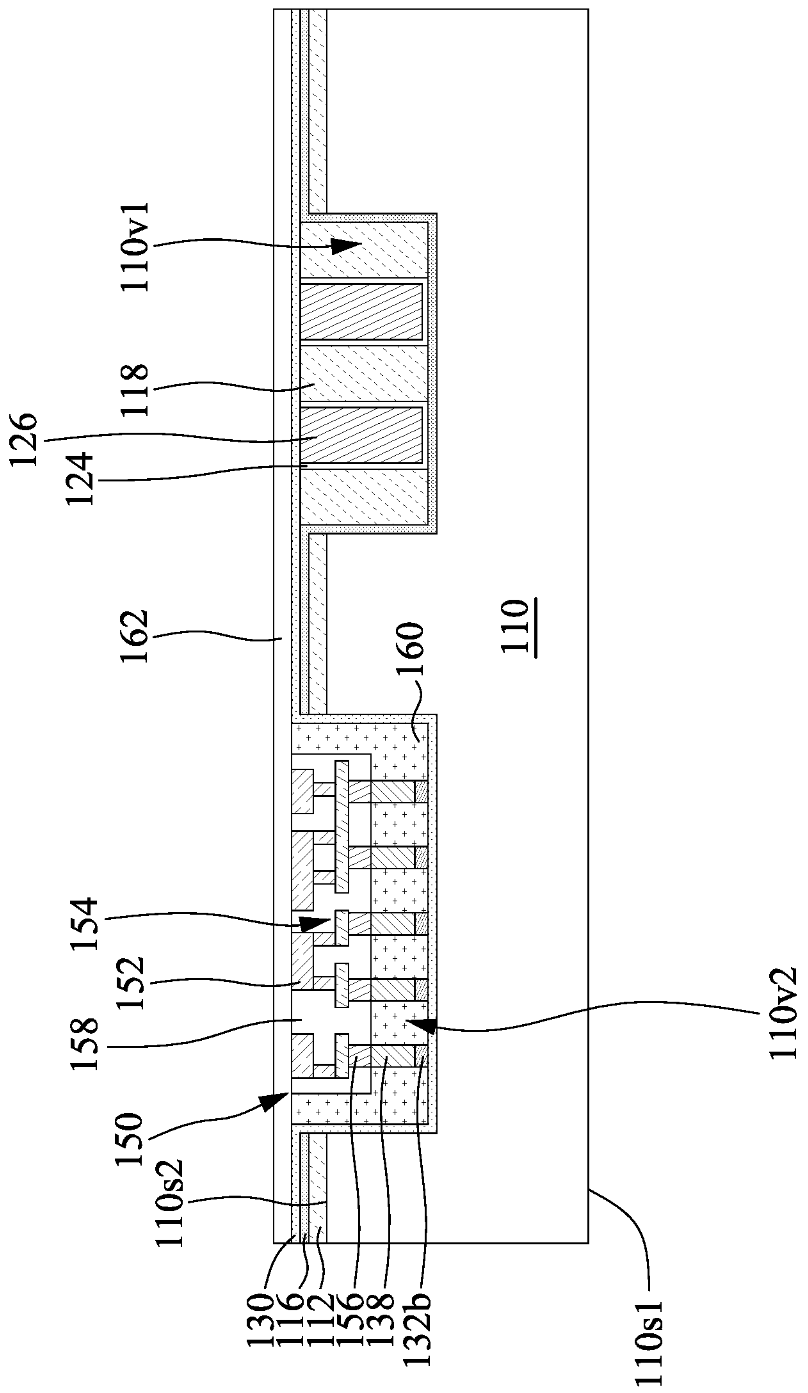
FIG. 15 illustrates one or more various stages of manufacturing a semiconductor device, in accordance with some embodiments of the present disclosure.

Referring to FIG. 15, a dielectric layer 162 may be formed on the package structure 150. The dielectric layer 162 may cover the protection layer 130. The dielectric layer 162 may be formed by CVD, ALD, PVD, or other suitable techniques.

Figure 16:
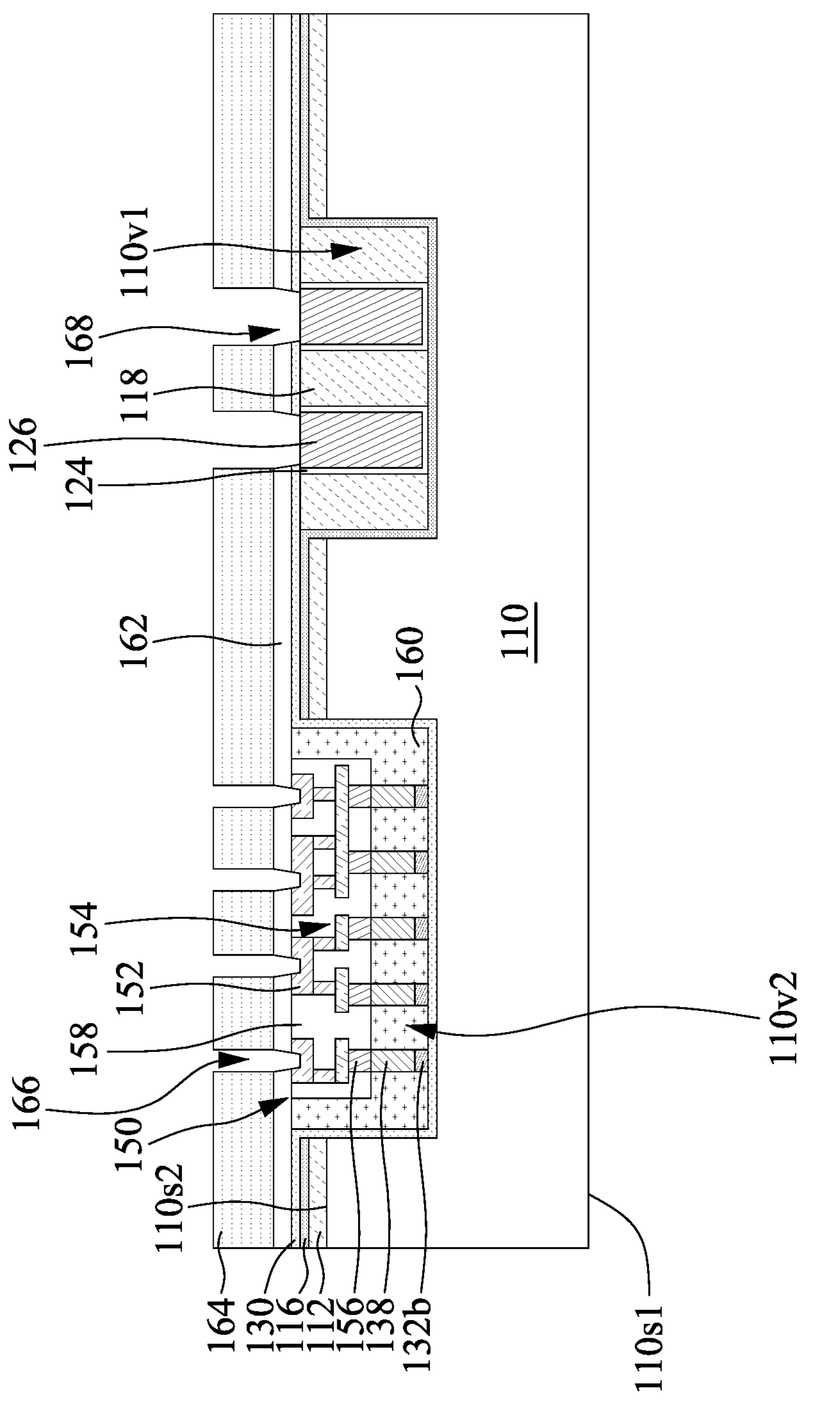
FIG. 16 illustrates one or more various stages of manufacturing a semiconductor device, in accordance with some embodiments of the present disclosure.

Referring to FIG. 16, a mask 164 may be formed on the dielectric layer 162. The mask 164 may include a positive-tone or negative-tone photoresist such as a polymer. The mask 164 may be patterned to have openings 166 and 168. In some embodiments, the opening 166 may penetrate the mask 164 and the dielectric layer 162. In some embodiments, the opening 166 may penetrate a portion of the electronic component 152. In some embodiments, the opening 166 may be located above the cavity 110*v*2. In some embodiments, the opening 168 may penetrate the mask 164 and the dielectric layer 162. In some embodiments, the opening 168 may penetrate the protection layer 130. In some embodiments, the opening 168 may be located above the cavity 110*v*1. The conductive via 126 may be exposed from the opening 168.

Figure 17:
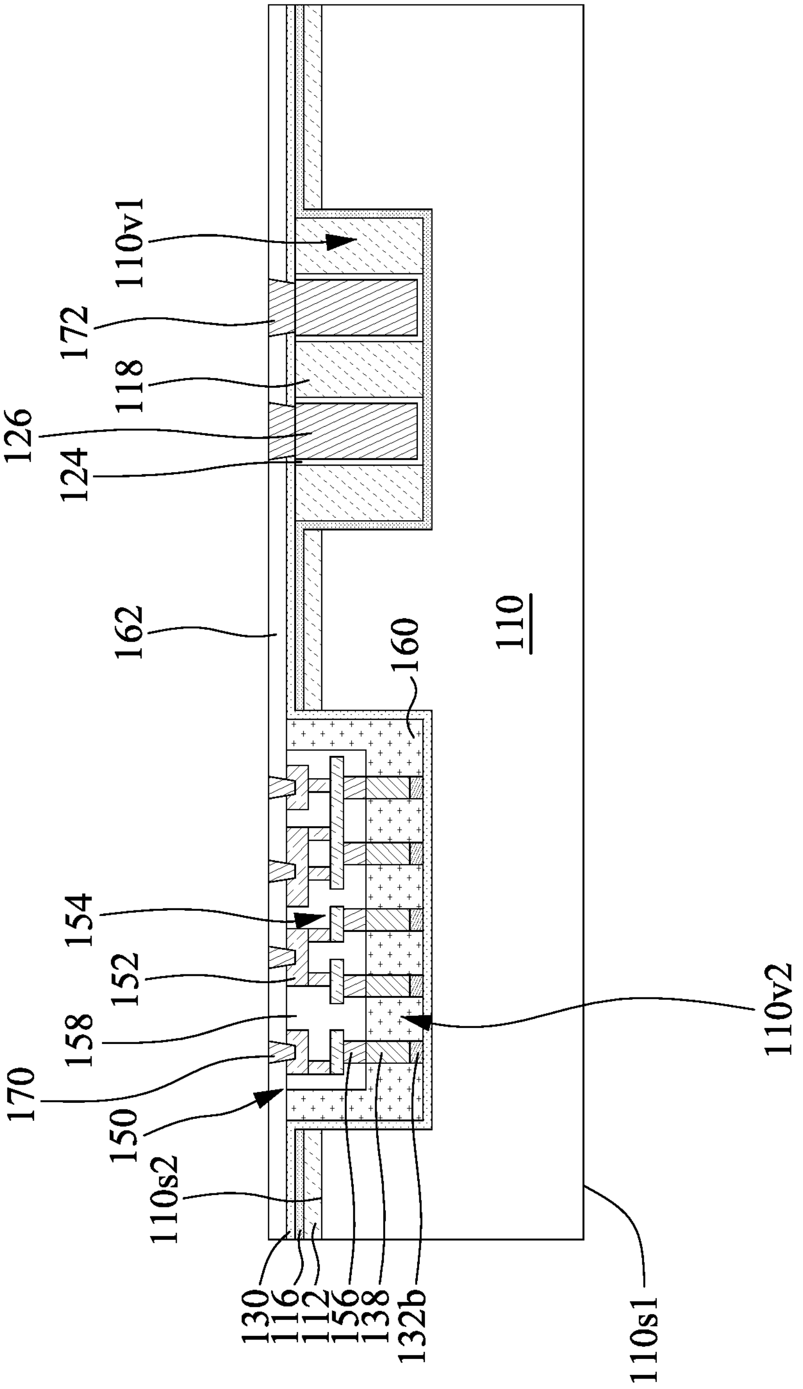
FIG. 17 illustrates one or more various stages of manufacturing a semiconductor device, in accordance with some embodiments of the present disclosure.

Referring to FIG. 17, the mask 164 may be removed, and conductive elements 170 and 172 may be formed. The conductive element 170 may be formed within the opening 166 as shown in FIG. 16. The conductive element 172 may be formed within the opening 168 as shown in FIG. 16. In some embodiments, a conductive layer (not shown) may be formed, for example, by CVD, ALD, PVD, electroplating, or other suitable techniques, on the dielectric layer 162. The conductive layer may fill the openings 166 and the 168, and a CMP technique may be performed to remove the excessive portion of the conductive layer. As a result, the conductive elements 170 and 172 may be formed.

Figure 18:
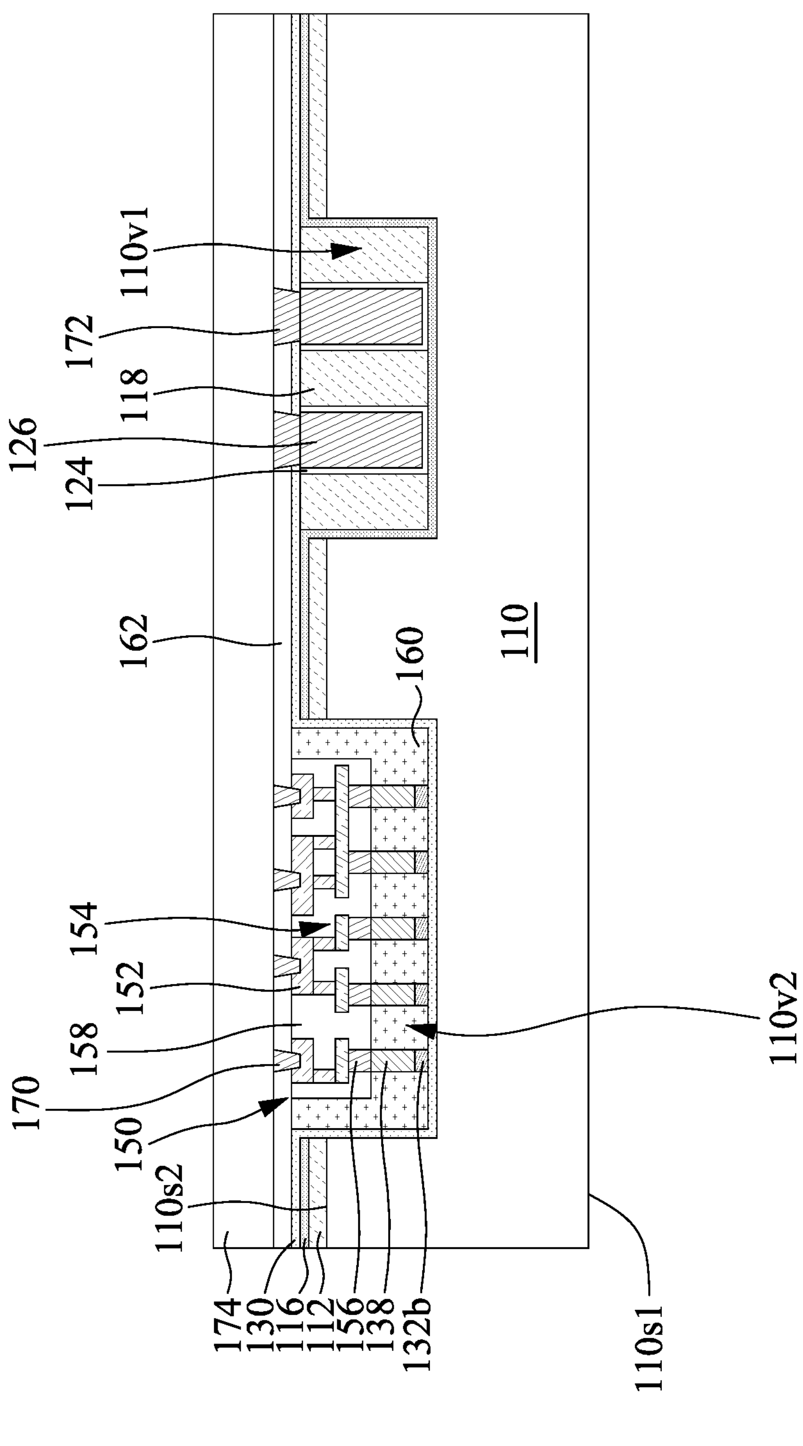
FIG. 18 illustrates one or more various stages of manufacturing a semiconductor device, in accordance with some embodiments of the present disclosure.

Referring to FIG. 18, the interposer 110 may be attached to a carrier 174. The carrier 174 may be in contact with the dielectric layer 162. The carrier 174 may include a glass substrate, a ceramic substrate, a plastic substrate, or other suitable carriers.

Figure 19:
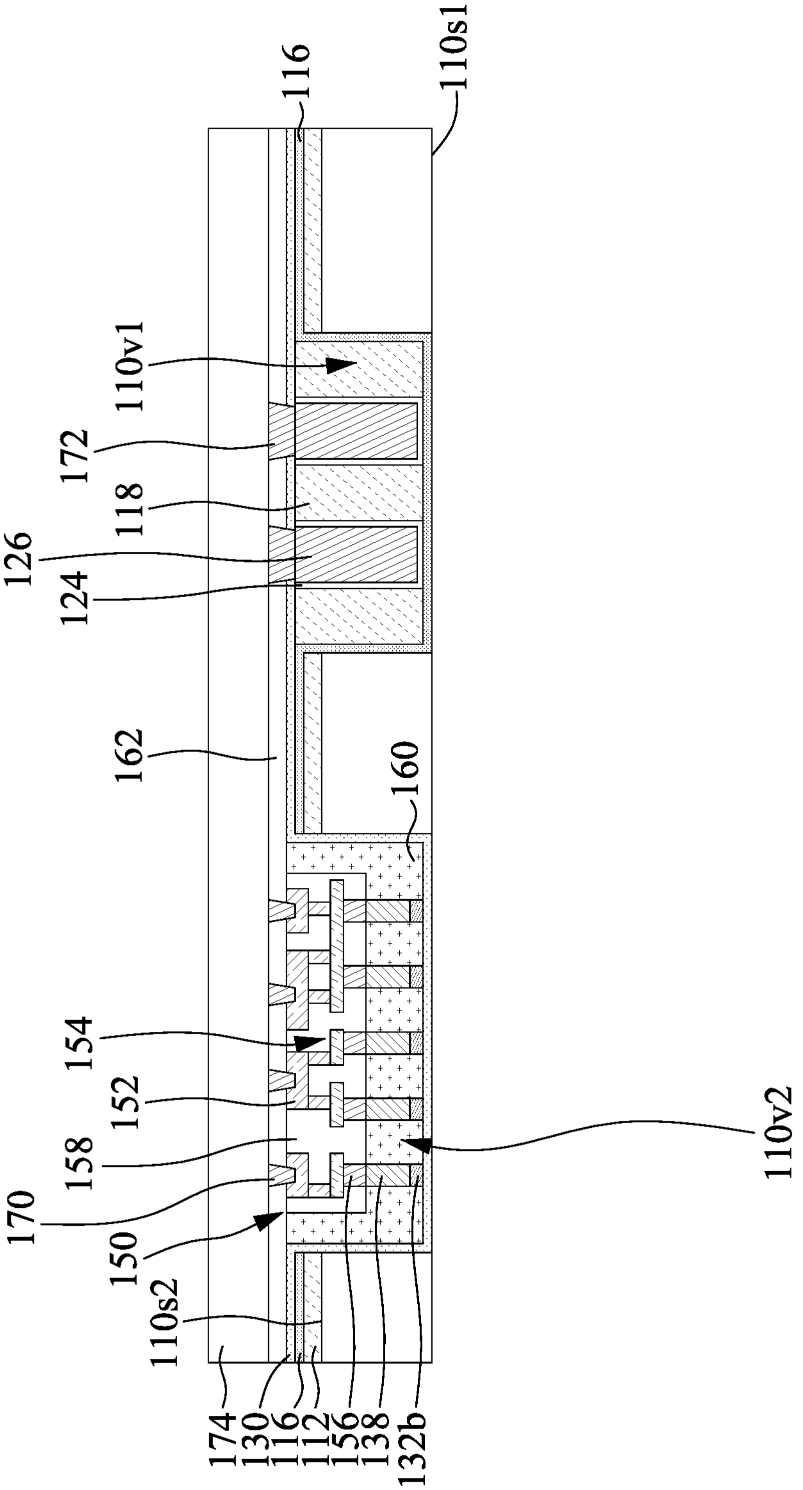
FIG. 19 illustrates one or more various stages of manufacturing a semiconductor device, in accordance with some embodiments of the present disclosure.

Referring to FIG. 19, a grinding technique, such as CMP technique may be performed on the surface 110*s*1 of the interposer 110. In some embodiments, the protection layer 116 may serve as a polishing stop layer (e.g., CMP stop layer). In some embodiments, the protection layer 130 may serve as a polishing stop layer (e.g., CMP stop layer). The protection layers 116 and 130 may be exposed from the interposer 110.

Figure 20:
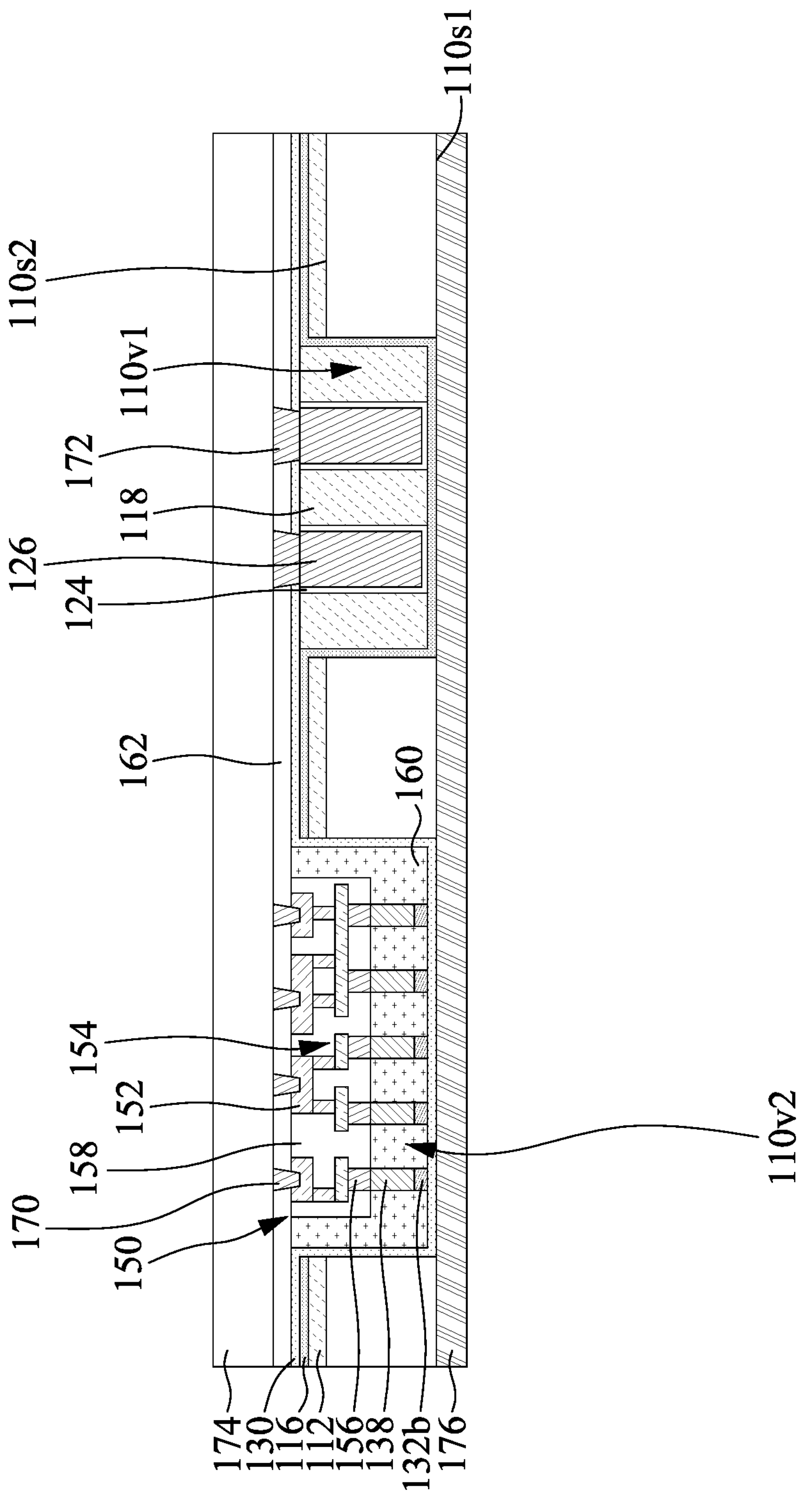
FIG. 20 illustrates one or more various stages of manufacturing a semiconductor device, in accordance with some embodiments of the present disclosure.

Referring to FIG. 20, a sacrificial layer 176 may be formed on the surface 110*s*1 of the interposer 110. The sacrificial layer 176 may include silicon oxide, silicon nitride, silicon oxynitride, or a combination thereof. The sacrificial layer 176 may be formed by CVD, ALD, PVD, electroplating, or other suitable techniques.

Figure 21:
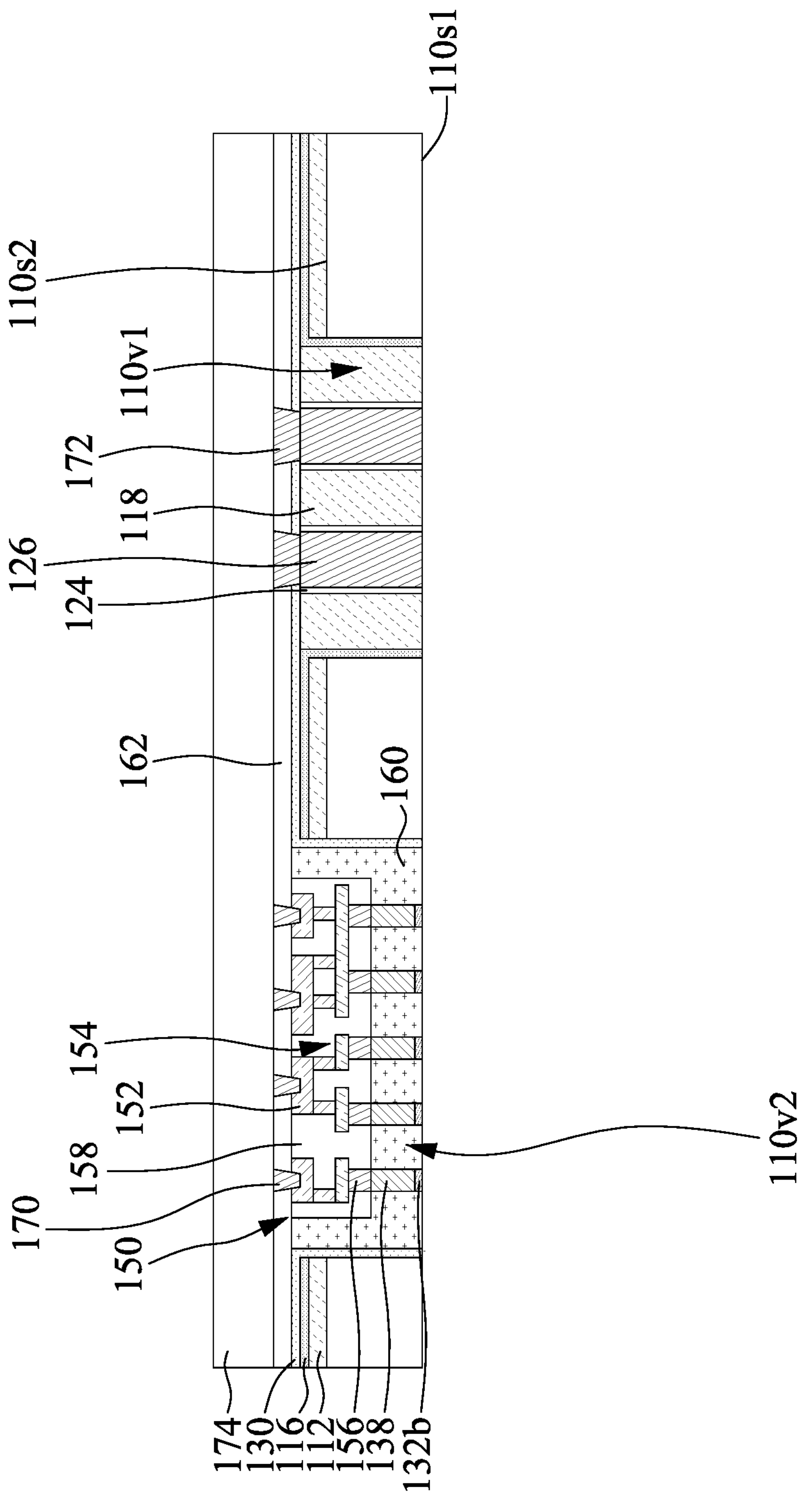
FIG. 21 illustrates one or more various stages of manufacturing a semiconductor device, in accordance with some embodiments of the present disclosure.

Referring to FIG. 21, a polishing technique, such as a CMP technique may be performed to remove the sacrificial layer 176. In some embodiments, the bottom of the protection layer 116 may be removed. In some embodiments, the bottom of the protection layer 130 may be removed. In some embodiments, a portion of the seed layer 124 may be removed, and the bottom of the conductive via 126 may be exposed. The surface 110*s*1 of the interposer 110 may be exposed.

Figure 22:
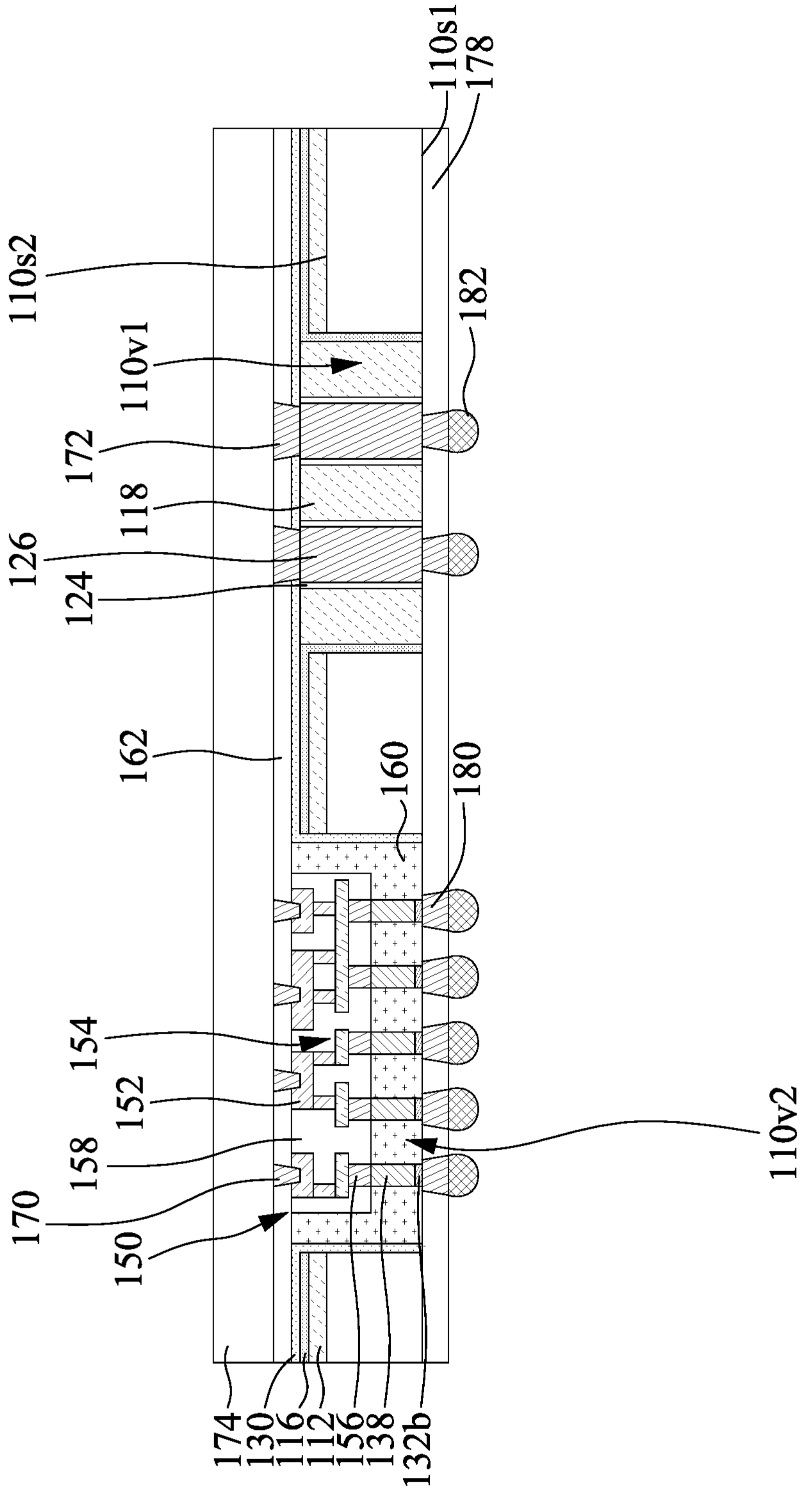
FIG. 22 illustrates one or more various stages of manufacturing a semiconductor device, in accordance with some embodiments of the present disclosure.

Referring to FIG. 22, a passivation layer 178 may be formed on the surface 110*s*1 of the interposer 110. The passivation layer 178 may be formed by coating or other suitable techniques. Conductive elements 180 may be formed within the passivation layer 178. Electrical connections 182 may be formed on the conductive element 180.

Figure 23:
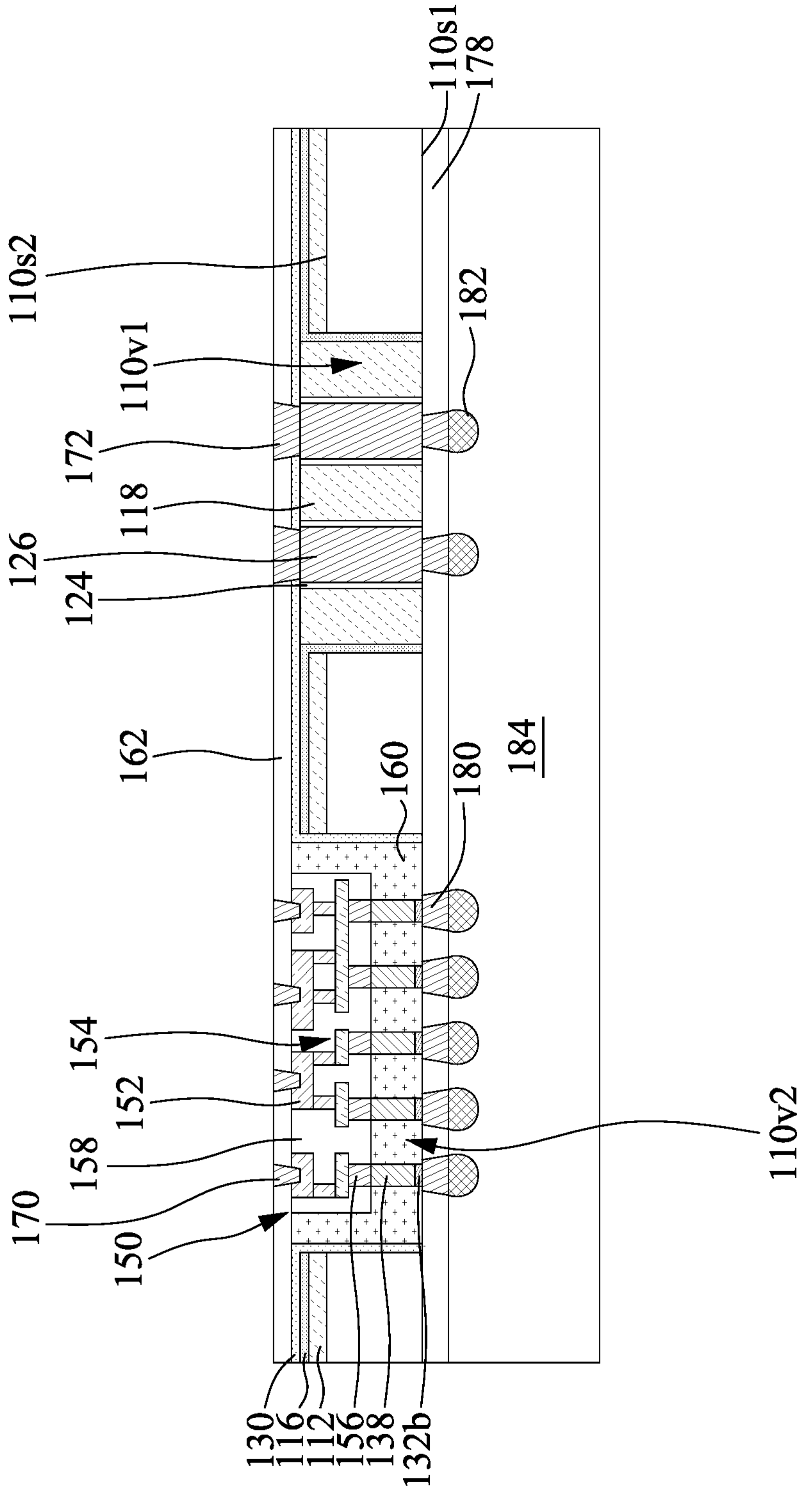
FIG. 23 illustrates one or more various stages of manufacturing a semiconductor device, in accordance with some embodiments of the present disclosure.

Referring to FIG. 23, the surface 110*s*1 of the interposer 110 may be attached to a holder 184. The holder 184 may include a tape, or other suitable materials. The carrier 174 may be removed.

Figure 24:
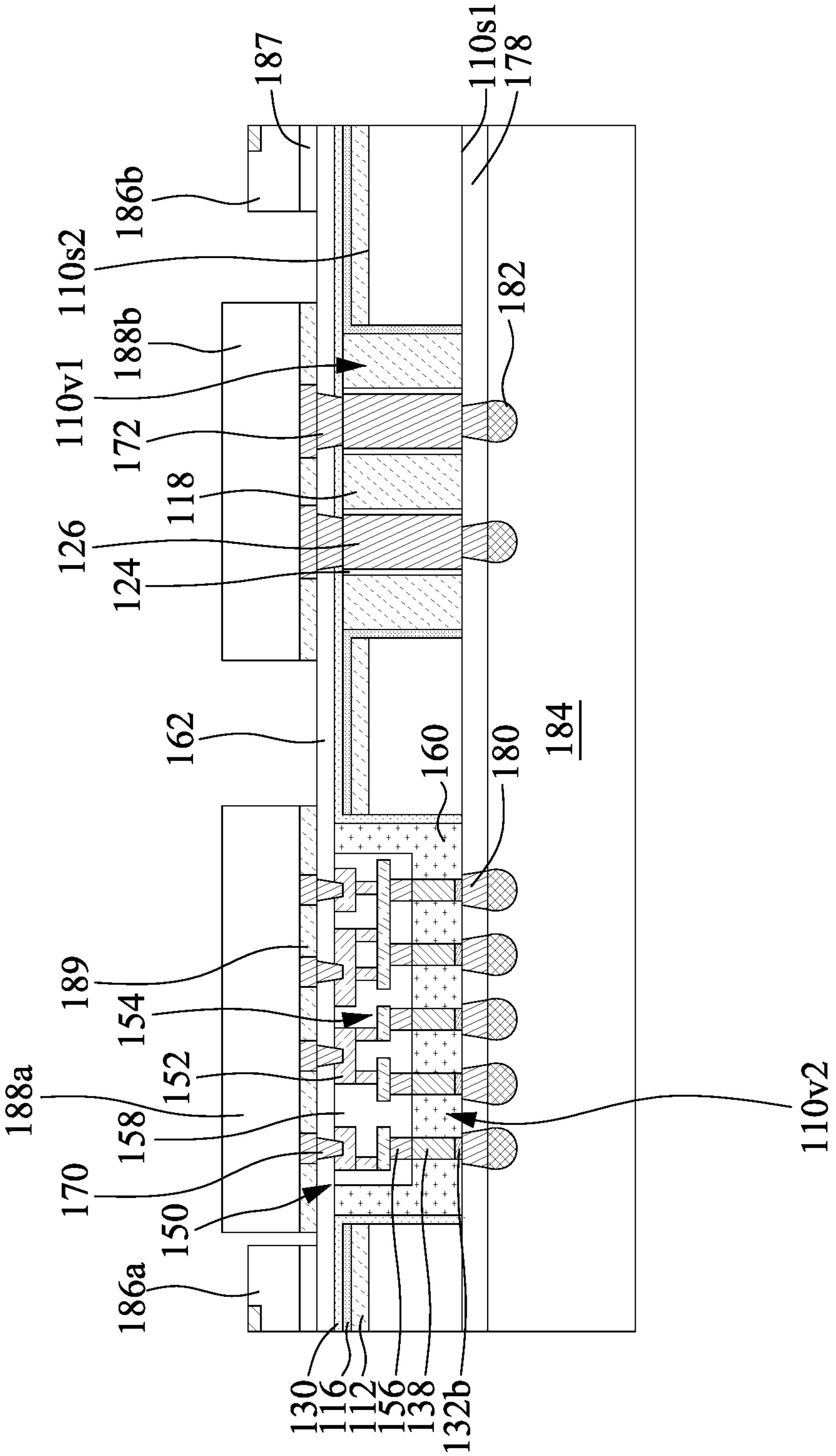
FIG. 24 illustrates one or more various stages of manufacturing a semiconductor device, in accordance with some embodiments of the present disclosure.

Referring to FIG. 24, electronic components 186*a*, 186*b*, 188*a*, and 188*b* may be attached to the surface 110*s*2 of the interposer 110. The electronic components 186*a* and 186*b* may be attached to the dielectric layer 162 by an adhesive layer 187. The passivation layer 189 and the conductive element 190 may be formed on the active surface of the electronic components 188*a* and 188*b*. In some embodiments, a hybrid bonding technique may be performed to bond the electronic components 188*a* (or 188*b*) and the dielectric layer 162 and the conductive element 170. The electronic component 188*a* may be disposed above the package structure 150. The electronic component 188*b* may be disposed above the conductive via 126.

Referring to FIG. 25, the interposer 110 may be sawed so that a plurality of structures as shown in FIG. 24 may be separated. A mother board 194 may be attached to the surface 110*s*1 of the interposer 110. In some embodiments, electrical connections 182 may be formed on the conductive elements 180. The conductive elements 180 may be bonded to the pads (not annotated) of the mother board 194.

Referring to FIG. 26, conductive wires 198 may be formed to electrically connect the mother board 194 and the electronic component 186*a* (or 186*b*). As a result, the semiconductor device 10 may be produced.

One aspect of the present disclosure provides a semiconductor device. The semiconductor device includes an interposer, a conductive via, an insulation layer, and a first electronic component. The interposer has a first surface and a second surface opposite to the first surface. The conductive via extends between the first surface and the second surface of the interposer. The insulation layer separates the conductive via from the interposer. The first electronic component is disposed on the second surface and electrically connected to the conductive via.

Another aspect of the present disclosure provides a semiconductor device. The semiconductor device includes an interposer, a through-insulation via (TIV), a first electronic component, and a second electronic component. The interposer has a first surface and a second surface opposite to the first surface. The interposer defines a first cavity and a second cavity extending between the first surface and the second surface. The TIV is disposed within the first cavity. The first electronic component is disposed on the second surface of the interposer and electrically connected to the TIV. The second electronic component is disposed within the second cavity.

Another aspect of the present disclosure provides a method of manufacturing a semiconductor device. The method includes: providing a substrate; defining a first cavity of the substrate; forming a through-insulation via (TIV) within the first cavity of the substrate; defining a second cavity of the substrate; disposing a first electronic component within the second cavity; and disposing a second electronic component over the TIV.

The embodiments of the present disclosure disclose a semiconductor device. The semiconductor device includes a through-insulation via (TIV) penetrating an interposer. The TIV has a relatively small parasitic capacitance in comparison with a through-silicon via (TSV). Further, in comparison with TSV which needs a polishing technique to remove a silicon substrate in order to expose the TSV, the depth of the TIV may be relatively well controlled.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:

an interposer having a first surface and a second surface opposite to the first surface, wherein the interposer defines a first cavity and a second cavity extending between the first surface and the second surface;

a through-insulation via (TIV) disposed within the first cavity;

a first electronic component disposed on the second surface of the interposer and electrically connected to the TIV;

a second electronic component disposed within the second cavity at a position that the second electronic component is embedded within the interposer;

an insulation layer disposed within the first cavity and penetrating the interposer; and an encapsulant disposed within the second cavity and encapsulating the second electronic component, wherein the encapsulant fully penetrates the interposer;

wherein the first cavity and the second cavity are recessed from the first surface of the interposer to define a bottom of the first cavity and a bottom of the second cavity above the second surface of the interposer;

wherein a depth of the first cavity is equal to a depth of the second cavity.

2. The semiconductor device of claim 1, further comprising:

a first protection layer covering the insulation layer.

3. The semiconductor device of claim 1, further comprising:

a conductive pillar disposed within the second cavity and electrically connected to the second electronic component, wherein the encapsulant is only disposed in the second cavity while the first cavity is free of the encapsulant.

4. The semiconductor device of claim 3, wherein the conductive pillar is encapsulated by the encapsulant.

5. The semiconductor device of claim 1, further comprising:

a second protection layer disposed on the second surface of the interposer, wherein the second protection layer has a lower surface coplanar with the first surface of the interposer and an upper surface coplanar with an upper surface of the encapsulant.

6. The semiconductor device of claim 5, wherein the lower surface of the second protection layer is substantially coplanar with a fourth surface of the TIV.

7. The semiconductor device of claim 1, further comprising:

a third electronic component disposed on the second surface of the interposer, wherein the third electronic component is connected to the interposer through an adhesive layer, wherein the third electronic component is free from overlapping the first cavity and the second cavity of the interposer.

8. The semiconductor device of claim 7, wherein the third electronic component is free from overlapping the first cavity and the second cavity of the interposer.

9. The semiconductor device of claim 1, further comprising;

a mother board facing the first surface of the interposer; and a conductive wire electrically connecting the third electronic component and the mother board.

10. The semiconductor device of claim 9, wherein the TIV is electrically connected to the mother board.

* * * * *